US007899638B2

(12) United States Patent  (10) Patent No.: US 7,899,638 B2
Miller  (45) Date of Patent: Mar. 1, 2011

(54) ESTIMATING BIT ERROR RATE PERFORMANCE OF SIGNALS

(75) Inventor: Martin Miller, Chester, NY (US)

(73) Assignee: LeCroy Corporation, Chestnut Ridge, NY (US)

( * ) Notice: Subject to any disclaimer, the term of this patent is extended or adjusted under 35 U.S.C. 154(b) by 110 days.

(21) Appl. No.: 11/581,647

(22) Filed: Oct. 16, 2006

(65) Prior Publication Data

US 2007/0136012 A1  Jun. 14, 2007

Related U.S. Application Data

(60) Provisional application No. 60/727,695, filed on Oct. 18, 2005.

(51) Int. Cl.
*G01R 29/26* (2006.01)
(52) U.S. Cl. ............. 702/86; 702/69; 324/620; 375/226
(58) Field of Classification Search .............. 702/57, 702/69, 66, 67, 70–72; 324/620, 622, 624; 375/226, 227; 714/704
See application file for complete search history.

(56) References Cited

U.S. PATENT DOCUMENTS

| 4,827,431 | A | * | 5/1989 | Goldshtein | .................. 375/226 |
| 5,012,494 | A | | 4/1991 | Lai et al. | |
| 5,652,668 | A | * | 7/1997 | Aulet et al. | ..................... 398/23 |
| 6,069,718 | A | * | 5/2000 | Khaleghi | ........................ 398/27 |
| 6,131,049 | A | * | 10/2000 | Marsan et al. | ................ 455/574 |

OTHER PUBLICATIONS

"The Difference Between Edge-To-Reference and Edge-To-Edge "Jitter" Analysis," LeCroy Technical Brief by Dr. Martin Miller, Jan. 27, 2005, pp. 1-4.

"Comparison of DCD+ISI Measurements For SDA, Wavecrest SIA3000 and a Sampling Oscilloscope," LeCroy Technical Brief by Dr. James Mueller and Dr. Martin Miller, Jan. 27, 2005, pp. 1-5.
"Bridging the Gap Between BER and Eye Diagrams—A BER Contour Tutorial," BERTScope, The Logical Evolution of Test by Guy Foster, SyntheSys Research, Inc., Oct. 2005, pp. 1-9.
"Jitter Analysis: The dual-Dirac Model, RJ/DJ, and Q-Scale," Agilent Technologies, Dec. 2004, pp. 1-16.
"Random Noise Contribution to Timing Jitter—Theory and Practice," Maxim, Dallas Semiconductor, Sep. 2005, 14 pgs.
"A Simple Method For Estimation of True Jitter For Period, Skew, Half-Period and Cycle-Cycle Jitter," LeCroy Technical Brief by Dr. Martin Miller, Jan. 18, 2005, pp. 1-2.
"Understanding and Characterizing Timing Jitter," Tektronix, pp. 1-24.

(Continued)

*Primary Examiner* — Manuel L Barbee
(74) *Attorney, Agent, or Firm* — Gordon Kessler

(57) ABSTRACT

A system for estimating bit error rates (BER) may include using a normalization factor that scales a BER to substantially normalize a Q-scale for a distribution under analysis. A normalization factor may be selected, for example, to provide a best linear fit for both right and left sides of a cumulative distribution function (CDF). In some examples, the normalized Q-scale algorithm may identify means and probabilistic amplitude(s) of Gaussian jitter contributors in the dominant extreme behavior on both sides of the distribution. For such contributors, means may be obtained from intercepts of both sides of the CDF(Qnorm(BER)) with the Q(BER)=0 axis, standard deviations (sigmas) may be obtained from reciprocals of slopes of best linear fits, and amplitudes may be obtained directly from the normalization factors. In an illustrative example, a normalized Q-scale algorithm may be used to accurately predict bit error rates for sampled repeating or non-repeating data patterns.

5 Claims, 21 Drawing Sheets

OTHER PUBLICATIONS

"Jitter Fundamentals—The Reference Standard For Signal Integrity Analysis," Wavecrest, pp. 1-16.

"Jitter Analysis Solutions Home In On Noise And Its Impact," Design & Manufacturing Newsletter Article, Aug. 2005, pp. 1-5.

"Delta Function." From MathWorld—A Wolfram Web Resource. Eric W. Weisstein. http://mathworld.wolfram.com/DeltaFunction.html.

"An Algorithm For Computing The Inverse Normal Cumulative Distribution Function," most recently modified Mar. 13, 2005 by Peter J. Acklam (pjacklam@online.no).

LeCroy Technical Brief: Transition Density: what does it affect and why is it explicitly specified within the LeCroy SDA?, M. T. Miller, Jan. 27, 2005. http://www.lecroy.com/tm/Library/WhitePapers/PDF/WP_TechBrief_Trans_Den.pdf.

"Tektronix Introduces Sampling Oscilloscope Software Providing Ultimate Validation and Conformance Test Capabilities for High Speed Serial Data Signals," www.tek.com, Aug. 2005.

"Impact of Noise on BER Estimation," by Michael Nelson and Pavel Zivny, Tektronix, Aug. 2005.

Error Function and Fresnel Integrals (Mathematical properties), "Handbook of Mathematical Functions with Formulas, Graphs, and Mathematical Tables," edited by Milton Abramowitz and Irene A. Stegun, National Bureau of Standards, Issued Jun. 1964, Tenth printing, Dec. 1972, with corrections, pp. 297-309.

"Precision Jitter Analysis Using the Agilent 86100C DCA-J, Agilent product note 86100C-1" Agilent Technologies, Jun. 16, 2004, pp. 1-28.

"Random Pattern Testability," J. Savir, G.S. Ditlow, and P.H. Bardell, IEEE Trans. Computers, Jan. 1984, pp. 79-90.

"Fibre Channel—Methodologies for Jitter and Signal Quality Specification (FC-MJSQ)," T11.2 project 1316-DT Rev. 14, Jun. 19, 2004, 263 pages.

Final Office Action dated Nov. 14, 2008 as cited in U.S. Appl. No. 11/362,499.

* cited by examiner

Tj(δδ) = 16.203 pS @ Q = 7.13, Dj(δδ) = 1.310 pS

Tj(δδ) = 16.292 pS @ Q = 7.13, Dj(δδ) = 1.985 pS

Tj(δδ) = 29.657 pS @ Q = 7.13, Dj(δδ) = 13.705 pS

Tj(δδ) = 29.822 pS @ Q=7.13, Dj(δδ) = 15.560 pS

ESTIMATING BIT ERROR RATE PERFORMANCE OF SIGNALS

CROSS REFERENCE TO RELATED APPLICATIONS

This application claims priority under 35 USC §119(e) to U.S. Patent Application Ser. No. 60/727,695, entitled "Jitter Measurement Method and Apparatus," which was filed by Miller on 18 Oct. 2005. This application also claims priority under 35 USC §120 to U.S. patent application Ser. No. 11/362,499, entitled "Measuring Components of Jitter," which was filed by Miller on 24 Feb. 2006 and is incorporated herein by reference, and which claims priority to: U.S. Patent Application Ser. No. 60/656,478, entitled "Separation of Vertical and Horizontal Noise Using Periodic Fit Residuals," which was filed by Miller on 25 Feb. 2005 and is incorporated herein by reference; and, to U.S. Patent Application Ser. No. 60/656,218, entitled "Resolution of Vertical Noise and Horizontal Noise Contributions from CIS Acquisition on Serial Data Patterns," which was filed by Miller et al. on 25 Feb. 2005 and is incorporated herein by reference.

TECHNICAL FIELD

Various embodiments relate generally to estimating performance of communication channels. Some embodiments relate to methods and systems for using a normalized Q-Scale to evaluate jitter and/or noise.

BACKGROUND

Data rates continue to increase in digital systems, communication systems, computer systems, and in other applications. In such applications, various devices may communicate by sending or receiving signals that are encoded with information in the form of signal levels (e.g., amplitude) in certain intervals of time. Proper decoding of periodic signals, for example, may involve measuring the signal level in the correct time interval, or period. As data rates increase, margins of error in the signal level timing tend to decrease.

In general, errors in which a signal deviates in its timing from an ideal timing is sometimes referred to as "jitter." For example, an increase in jitter for a signal encoded with a stream of digital data may cause an increase in a bit error rate (BER) for that data stream.

Jitter may be added to a signal from a variety of sources. For example, one source of jitter may be in circuit elements used that generate, transmit, convey, process, and/or receive the signal. To various degrees, circuit elements may add jitter to the signal through cross-talk, reflections, shot noise, flicker noise, and/or thermal noise. Electromagnetic interference (EMI) may also contribute to jitter.

Typically, jitter may be measured as a total jitter. Total jitter may represent a convolution of all independent jitter components, which can include contributions from deterministic and/or random components. Random jitter, such as that caused by noise, typically exhibits a Gaussian distribution. Deterministic jitter may include periodic jitter, duty cycle distortion, and/or intersymbol interference, for example.

Jitter measurements may be made in a variety of applications, examples of which may include Fibre Channel, Gigabit Ethernet, XAUI, InfiniBand, SONET, Serial ATA, 3GIO, and Firewire. To illustrate the importance of jitter in such applications, a nanosecond of jitter in a 100baseT (100 Mb/s) device may represent a 10% data uncertainty. For example, the same nanosecond of jitter may represent a 20% data uncertainty if the data rate is increased to 200 Mb/s, or a 100% data uncertainty in a Gigabit Ethernet device.

Reliability of a communication system may influence the effective capacity of that system for communicating information. One way to measure of reliability of a data channel relates to a bit error rate (BER) for that channel. For example, if a data channel has an average of one bit error for every one thousand bits transmitted, then that channel may be described as having a BER of $1/1000$, or $10^{-3}$. If the reliability of the communication channel is degraded, data rates and/or data volume may need to be limited so as not to exceed the channel's capacity.

Examples of data channels may be found in backplanes, optical systems, wireless communication systems, and/or wired communication links. Some communication systems are configured as electronic networks that allow data to be shared (e.g., movies, files, images, voice). Data channels of various types may be connected to form networks, such as WAN (wide area networks), LAN (local area networks), and/or MAN (metropolitan area networks). When using such networks, information may be transmitted through wired data channels, such as DSL (digital subscriber line), and/or wireless data channels, such as WiMax or WiFi, for example.

As data rates increase, maintaining a specified BER in a typical data channel tends to become increasingly difficult. In some applications, increased BER leads to increased requests for re-transmissions, which may in turn reduce the effective capacity of the data channel. Accordingly, data channels with low bit error rate performance may provide higher effective data capacity.

SUMMARY

A system for estimating bit error rates (BER) may include using a normalization factor that scales a BER to substantially normalize a Q-scale for a distribution under analysis. A normalization factor may be selected, for example, to provide a best linear fit for both right and left sides of a cumulative distribution function (CDF). In some examples, the normalized Q-scale algorithm may identify means and probabilistic amplitude(s) of Gaussian jitter contributors in the dominant extreme behavior on both sides of the distribution. For such contributors, means may be obtained from intercepts of both sides of the CDF(Qnorm(BER)) with the Q(BER)=0 axis, standard deviations (sigmas) may be obtained from reciprocals of slopes of best linear fits, and amplitudes may be obtained directly from the normalization factors. In an illustrative example, a normalized Q-scale algorithm may be used to accurately predict bit error rates for sampled repeating or non-repeating data patterns.

In some embodiments, a normalized Q-scale analysis may be applied to analyze, for example, performance of a communication channel. For example, a waveform processor may analytically separate total jitter of a signal into estimates of its horizontal (e.g., time) and vertical (e.g., amplitude) components. The individual horizontal and/or vertical contributors to jitter may be separately characterized by applying a normalized Q-scale analysis. In some embodiments, a normalized Q-scale analysis may be used to evaluate to what degree some dominant contributors to jitter may be Gaussian. In some embodiments, a search for optimal values for a Q-scale normalization factor may be automated by iteratively selecting values, determining a Q-scale based on a BER adjusted by the selected normalization factor value, and evaluating a degree of linear fit of the determined Q-scale.

The details of one or more embodiments are set forth in the accompanying drawings and the description below. Other features and advantages will be apparent from the description and drawings, and from the claims.

DESCRIPTION OF DRAWINGS

This document describes these and other aspects in detail with reference to the following drawings.

DETAILED DESCRIPTION OF PREFERRED EMBODIMENTS

Figure 1:
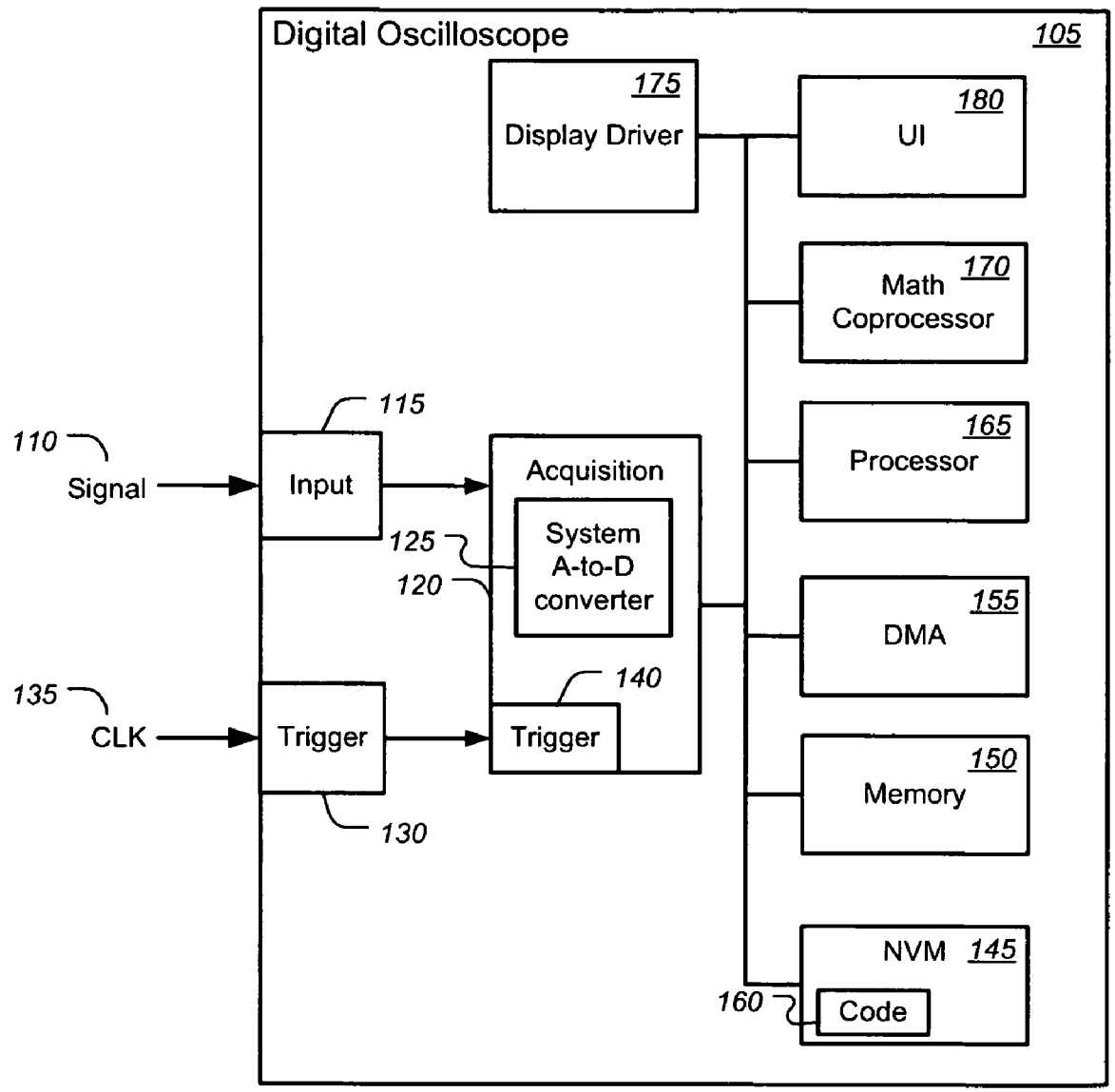
FIG. 1 shows a block diagram representation of an exemplary signal measurement system.

In an exemplary embodiment, FIG. 1 shows a signal measurement system 100 with extended jitter analysis capabilities that include resolving total jitter into its horizontal jitter and vertical jitter components. In various embodiments, the system 100 may include a waveform processing system, such as a digital oscilloscope. In this example, the system 100 includes a digital oscilloscope (DO) 105 capable of measuring total jitter of an input signal 110.

Sometimes the term "jitter" is used to refer to phase or time domain error (such as that caused by an oscillator that does not hold a fixed frequency) in contrast to "noise," a term which is sometimes used to refer to amplitude error (such as that caused by voltage spikes induced by electromagnetic interference). Alternatively, the term "jitter" may be viewed as including "vertical jitter" that corresponds to amplitude error and "horizontal jitter" that corresponds to time domain error. In this conceptualization of jitter, vertical jitter sometimes corresponds to noise effects and horizontal jitter is sometimes referred to as "true jitter" or "time domain jitter." As used herein, the term "jitter" is used in the latter sense.

In the system 100, the DO 105 is modified to perform operations to resolve a measured total jitter of the input signal 110 into an estimated horizontal jitter and an estimated vertical jitter. An operator, such as a communication engineer, a digital signal processing (DSP) engineer, or a network designer, may use the signal measurement system 100 to estimate timing and amplitude jitter in a wired, wireless, fiber optic, or hybrid communication system. By resolving the jitter into temporal and amplitude components, the operator may be better able to optimize signal transmission performance and/or signal integrity in the communication system.

As an example, the system 100 may quantify a horizontal jitter ($J_H$) component and/or a vertical jitter ($J_V$) component present in the input signal 110. In some applications, the system 100 may be used to estimate a horizontal signal jitter ($J_{SH}$) and/or a vertical signal jitter ($J_{SV}$) in the input signal 110. In some further applications, the system may be used to estimate a horizontal intrinsic jitter ($J_{IH}$) and/or a vertical intrinsic jitter ($J_{IV}$) added to input signals by the DO 105. In some embodiments, the system 100 may use predetermined information about the horizontal and/or vertical jitter introduced by the DO 105 to generate improved estimates of $J_{SV}$ and $J_{SH}$.

In various embodiments, the digital oscilloscope 105 may be a real-time oscilloscope, an equivalent time (ET) oscilloscope, or a near real-time oscilloscope (NRO) that uses coherent interleaved sampling (CIS). An example of a NRO is a WaveExpert 9000 SDA 100G oscilloscope manufactured by LeCroy Corporation in Chestnut Ridge, N.Y. Various embodiments may be adapted from digital storage oscilloscopes, digital sampling oscilloscopes, or other signal measurement systems, such as data acquisition equipment.

Some embodiments may provide an input waveform digitizing system to provide waveform data to a processing system configured to determine horizontal and vertical components of jitter as described elsewhere herein. For example, an optical waveform may be acquired for analysis of its horizontal and/or vertical jitter components by converting the optical signal to an electrical signal using an electro-optical converter, and then digitized, for example, by one or more analog-to-digital converters. In some embodiments, the system may be provided in a digital oscilloscope.

In some embodiments, the system 100 can analyze jitter in the input signal 110 that is either repetitive or non-repetitive. The input signal 110 may be a radio frequency (RF) signal, an optical signal, a serial data signal, a multilevel data signal etc. For example, the input signal 110 under measurement may have characteristics of a clock signal, a periodic signal, a serial data with return to zero (RZ) data pattern, or a serial data with non-return to zero (NRZ) data pattern. In some embodiments, a curve may be fit to a periodic signal such as a clock signal.

As an example, the system 100 can generate an estimate of horizontal and/or vertical jitter in the input signal 110 by resolving the measured total jitter into $J_H$ and the $J_V$ components. The system 100 can generate an estimate of total jitter in the input signal 110 by reducing contribution of the intrinsic jitter introduced by the signal measurement system 100 in the estimated total jitter. In various examples, the system may be used to quantify horizontal jitter and vertical jitter present in a signal and/or in an observed measurement. As budgets for jitter are reduced in some applications, quantitative analysis of the horizontal and vertical jitter may provide valuable insight to improve designs or assess system performance, for example.

A serial data communication engineer, RF communication engineer, or a digital hardware engineer, for example, may use the horizontal or vertical jitter component information to design, analyze, test, and/or maintain, for example, a communication system with high bit rate, such as five gigabits per second (Gb/s) or above. For example, relative or absolute information about horizontal and/or vertical jitter may be applied by an engineer to, e.g., adjust filtering, locate impedance changes in the communication link, adjust source amplitude, adjust source/sink impedance, termination, oscillator stability, EMI (e.g., shielding, better cables). To control amplitude and/or timing jitter, an engineer may adjust edge slew rates, for example, to reduce the contribution of vertical noise on subsequent stages. In some cases, the engineer may select different components, supply voltages, and/or technologies (e.g., ECL, TTL, CMOS). For some clocks, a resonance characteristic (e.g., quality factor, Q) may be adjusted.

In this example, the input signal 110 is received by the DO 105 through an input interface 115, and then the signal 110 passes to an acquisition module 120 for processing. The input interface 115 may include, for example, a connector, antenna, or detector (e.g., photo receiver) suitable to receive the input signal 110. In some applications, the signal 110 may be sensed by an active or passive probe coupled to a transmission line, air link, or other transmission channel or medium. The signal may be sensed, transported, and/or received using, for example, coaxial cable, microstrip, coplanar waveguides, waveguides, ribbon cable, shielded or unshielded twisted pair, optical fiber, antenna, printed circuits, or a combination of any of these or other similar apparatus. In various applications, the input signal 110 may be originated from a signal generator, analog and/or digital circuitry, transceivers (e.g., modem), wired or wireless or fiber optic communications equipment, or other apparatus for which signal jitter measurement and analysis may be of interest.

In some applications, jitter analysis may be performed at the design phase, or during design qualification testing. Jitter analysis may also be performed to test the inter-operability of equipment, such as equipment from different manufacturers that operate together in a system, such as a telecommunication system, for example.

After passing through the input interface 115, the input signal 110 is received by the acquisition module 120. In this example, the acquisition module 120 may sample the input signal 110 for subsequent processing. In some embodiments, more than one period of a periodic input signal (e.g., a repetitive digital signal sequence) may be sampled. For example, the acquisition module 120 may take numerous samples of each bit in a 64-bit long repeating pattern, and repeatedly acquire samples from the 64-bit pattern for several thousand cycles of the pattern. The acquisition module 120 may acquire any practical number of samples for each bit, any pattern length, or cycles of the repeating pattern, subject to considerations such as effective sample rate, memory size, processing speed, system bandwidth, and/or accuracy specifications for example.

The acquisition module 120 includes an Analog-to-Digital converter (ADC) 125 to convert the analog input signal 110 into digital samples for processing and storage. For example, the ADC 125 may digitize the amplitude of the input signal 110 over a sequence of sample periods.

The system 100 further includes a trigger interface 130 that is coupled to receive a clock input (CLK) signal 135. In some embodiments, the CLK signal 135 may provide synchronization information for the input signal 110 to a trigger module 140 in the acquisition module 120. The trigger interface 130 may include, for example, an interface according to examples described with reference to the input 115. The CLK signal 135 may originate, for example, from a clock or other signal synchronized to the input signal 110.

In some embodiments, the system 100 may resolve jitter in the input signal 110 based on the CLK signal 135. In particular embodiments, the trigger module 140 may determine when to initiate sampling based on the CLK signal 135. For example, when using positive edge triggering and ET (equivalent time) acquisition sampling, the acquisition module 120 may trigger sampling when, during a positive edge transition, the CLK signal 135 reaches a user-specified threshold voltage.

In other embodiments, the system 100 may resolve jitter in the input signal 110 without receiving or using the CLK signal 135. In particular embodiments, the system 100 may use a sampling method that does not require external or hardware pattern recognition or synchronization. For example, in CIS (coherent interleaved sampling), the trigger module 140 may determine when to initiate sampling without reference to the CLK signal 135. In other examples, the trigger module 140 may initiate sampling once at the start of an acquisition of multiple periods of the input signal 110.

In various embodiments, jitter components of the input signal 100 may be analyzed without using any information extrinsic to the signal itself about the frequency, duty cycle, and/or period of the input signal 110. Some embodiments may process the input signal 100 without receiving information extrinsic to the signal itself about the signal pattern and/or pattern length. In some embodiments, the system 100 may resolve components of jitter without receiving information extrinsic to the signal itself about the encoding and/or encryption of the input signal 110. These and other examples are described in further detail with reference to FIG. 3.

The system 100 of this example also includes a processor 165 and a math coprocessor 170. The processor 165 and/or coprocessor 170 may perform various functions, such as supervisory, user interface, signal processing, and signal analysis, in support of the measurement system 100 operations. For example, the processor 165 may supervise various operations, such as waveform data collection and user interaction. The math coprocessor 170 may include one or more of the following: an ASIC (application specific integrated circuit), DSP (digital signal processor), discrete or integrated analog and/or digital circuits, and a dedicated digital logic architecture to perform mathematics functions, for example. The math coprocessor 170 may cooperate with the processor 165 to perform various functions. For example, the math coprocessor 170 may perform operations that include floating point arithmetic, signal processing, digital filtering (e.g., IIR, FIR) and/or numerical operations (e.g., curve fitting, numerical derivative computation, numerical integration, fast Fourier transformation (FFT), and interpolation). In various embodiments, the processors 165, 170 may cooperate to perform statistical analysis, such as computing the variance ($\sigma$) of a set of samples. Examples of some mathematical operations used to resolve horizontal and vertical components of jitter are described in further detail with reference to FIGS. 5-6C.

In this example, the processor 165 is coupled through a digital bus to memory devices, including a non-volatile memory (NVM) 145, a memory 150, and a Direct Memory Access (DMA) controller 155. The NVM 145 may provide a storage space for storing data (e.g., sampled waveform data acquired by the acquisition module 120) and/or executable instructions (e.g., application software). NVM 120 may include, for example, flash memory, read only memory (ROM), EEPROM, data storage devices with rotating media (e.g., optical or magnetic disc drive), tape storage devices, or any combination of such devices. The memory 150 may provide temporary storage for the sampled signal data from the acquisition module 120. The memory 150 may be, for example, RAM, a buffer, or cache memory, which may provide volatile data storage. In some embodiments, the processors 165, 170 may quickly access the memory 150 to retrieve and store data. In some embodiments, the memory 150 may also store intermediate results produced by the processor 165 and/or math coprocessor 170. For example, the memory 150 may store the data for an eye diagram generated for a repetitive bit pattern, and store a corresponding persistence map that provides data for each bit interval in the pattern. The DMA 155 may handle accesses of the memory 150 without direct involvement of the processors 165, 170. For example, the DMA 155 can move data from one memory location to another memory location. In another example, the DMA 155 may be configured to move samples of the sampled input signal 110 from the acquisition module 120 directly into sequential memory locations, such as an array in the memory 150 and/or the NVM 145, for subsequent jitter analysis. In yet another example, the acquired waveform data may be sent directly to a buffer or a cache that is quickly accessible to at least one of the processors 165, 170.

Data caching and/or streaming may be used to improve processing efficiency by, for example, reducing calculation time. In some embodiments, waveform, statistical analysis, and/or other processing operations performed by the system 100 may use caching and/or data streaming techniques to improve data processing efficiency. In certain embodiments, streaming architectures may be used to facilitate data processing operations that may be performed according to jitter analysis methods described herein. Suitable streaming architectures and associated methods that may be used in conjunction with the methods described herein include embodiments that are described in U.S. Pat. No. 6,539,318, which issued to Miller et al. on Mar. 25, 2003, and which is assigned to the assignee of the present application. The present application incorporates the Detailed Description and the Figures of U.S. Pat. No. 6,539,318 herein by reference.

In this example, the NVM 145 is coupled to the processor 165 by a digital address/data bus. The processor 165 may execute instructions and retrieve information stored in the NVM 145 via the bus. The NVM 145 includes a code module 160 containing instructions that, when executed by the processor 165 and/or math coprocessor 170, may cause the processor to perform operations to resolve a measured total jitter into its horizontal and vertical components. The NVM 145 may include a number of other code modules (not shown) to perform other operations, including operations in support of basic digital oscilloscope operations (e.g., user interface, boot-up, configurations, etc. . . . ).

In some embodiments, the processor 165 may execute instructions in the code 160 to measure total jitter in the input signal 110 and resolve the measured total jitter into $J_H$ and $J_V$. In one example, the NVM 145 may store measurement results from previous experiments so that a user can use the previous results for analysis, such as before-and-after studies on equipment modifications. In another example, the NVM 145 may include instructions that, when executed by the processor 165, perform operations to boot-up the system 100, store acquired samples of the input signal 110, and analyze the samples to determine horizontal and/or vertical components of jitter. In some embodiments, the NVM 145 may store information about the DO 105, such as impedance and/or frequency response information. In some applications, digital filters (e.g., IIR and/or FIR) may be used to improve or tailor the nominal frequency response of the channel. Such filters may provide a substantially flat frequency response over a frequency range, an effective bandwidth responsive to user input, high frequency noise compensation, and/or a desired frequency response. In some cases, the system 100 may include channel compensation that may effectively reduce horizontal and/or vertical jitter.

In certain embodiments, digital filtering, noise compensation, and frequency response tailoring may be used may be employed to measure and/or adjust observed jitter in waveform acquisition systems such as those described herein. Suitable digital filtering and associated methods that may be used in conjunction with the systems described herein include embodiments that are described in U.S. Pat. No. 6,701,335, which issued to Pupalaikis on Mar. 2, 2004, and which is assigned to the assignee of the present application. The present application incorporates the Detailed Description and the Figures of U.S. Pat. No. 6,701,335 herein by reference.

In further embodiments, intrinsic jitter information of the signal measurement system 100 is stored in the NVM 145. When measuring the input signal 110, for example, apparatus in the DO 105 may add, for example, thermal noise and/or quantization noise that may increase the measured vertical and/or horizontal jitter. Jitter added to the input signal 110 may be referred to as intrinsic jitter.

In some embodiments, the intrinsic jitter may be partly or substantially predetermined by design or by testing, either at manufacturing or at calibration, for example. In some implementations, impedance information may be stored in the NVM 145 and may be used to determine an estimate of horizontal and/or vertical intrinsic jitter. In some further embodiments, a look-up table or characteristic curve may be provided to determine expected values for horizontal and/or vertical intrinsic jitter based on measurement set-up. For example, the impedance of the source and/or transmission line for the input signal 110 may be determined, such as by auto-detection techniques or by user provided input. Based on the external impedance information, and/or other factors such as channel bandwidth (which may be variable) in the DO 105, the processor 165 may be programmed to identify estimates for horizontal and/or vertical intrinsic jitter.

The system 100 can use intrinsic jitter information, for example, to estimate horizontal and/or vertical jitter of the input signal 110 by subtracting (using, for example, quadrature subtraction) horizontal and/or vertical jitter contributed by the signal measurement system 100.

The system 100 also includes a display driver 175 and a user interface 180. The display driver 175 may format and send images for display on a display device (not shown) in the user interface 180. For example, the display driver 175 can send for display overlapping samples of a periodic waveform so that an operator can view an eye diagram that visually illustrates jitter in the measured input signal 110. An operator can use the user interface 180 to input commands and/or information to set-up and/or control operation of the system 100. In some embodiments, the operator may use the user interface 180 to input measurement set-up parameters. The set-up parameter may include, for example, number of periods of the input signal 110 to acquire, acquisition methods, pattern length, and/or bit rate of the data pattern. In another example, the operator may use the user interface 180 to initiate an analysis of horizontal and/or vertical components of jitter.

Using the signal measurement system 100, the operator may determine an estimate of jitter measurement of the input signal 110 after accounting for intrinsic jitter contributed by the system 100. For example, the operator may set up analysis by connecting the input signal 110 and the clock signal 135 to the DO 105. In another example, the operator may set up analysis without connecting the CLK input 135 in modes for which it is not required. From the user interface 180, the operator may select an acquisition mode for the acquisition module 120 and associated component. The user interface 180 may also permit the user to input information about the data pattern, such as the bit rate and the pattern length, the sampling interval of the data acquisition, and whether the sampling is triggered by the CLK input 135.

In various embodiments, the acquisition mode may be a CIS mode, a real-time acquisition, or an ET acquisition. The user may select the acquisition mode based on, at least partially, some characteristics of the input signal 110. Selection of the acquisition methods are described in further detail with reference in FIG. 3.

The processor 165 can initiate the acquisition module 120 to sample the input signal 110 via the input interface 115. The acquisition module 120 can convert the analog input signal 110 into digital samples using the ADC 125 and store the digitized data in the memory 150. The processor 165 can then use the data to perform a jitter analysis operation. In the jitter analysis operation, the processor 165 may instruct the math coprocessor 170 to perform some of the data manipulation and numerical algorithms functions. In some embodiments, the jitter analysis operation may include generating an eye diagram to estimate the total jitter in the input signal 110 and separate the total jitter into $J_V$ and $J_H$. The processor 165 can then retrieve a previously measured $J_{IV}$ and $J_{IH}$ from the NVM 145 or the memory 150. The processor 165 can then determine $J_{SV}$ and $J_{SH}$ by subtracting, such as using quadrature subtraction, $J_{IV}$ from $J_V$ and $J_{IH}$ from $J_H$.

Figure 2:
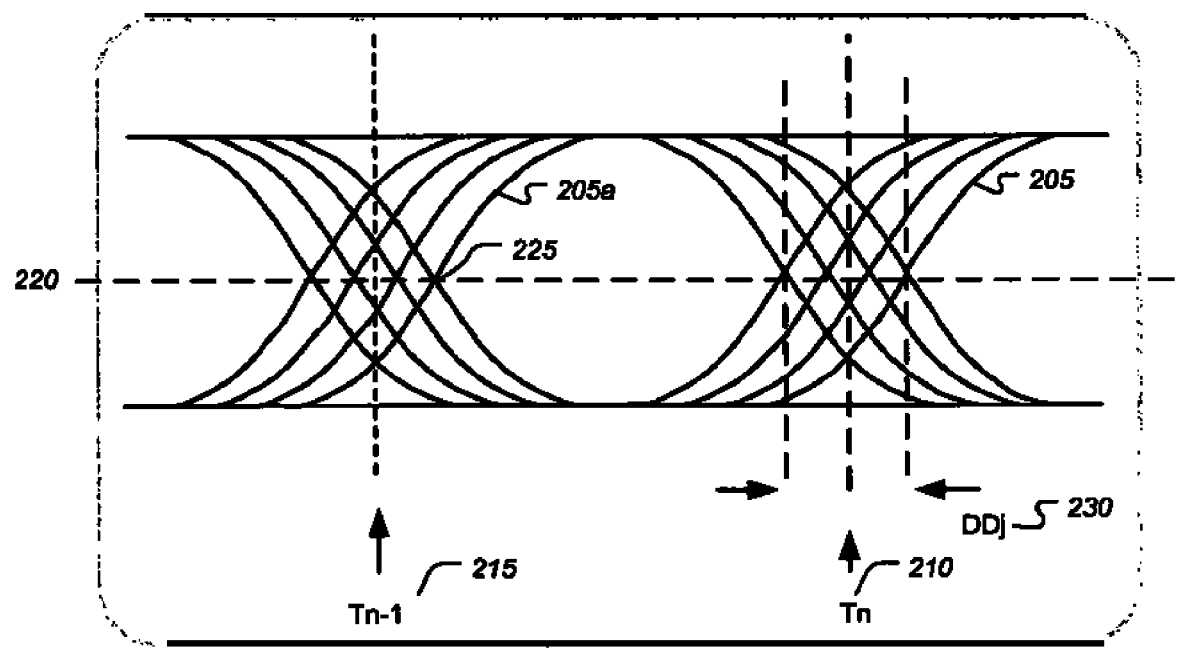
FIG. 2 shows an exemplary plot of an eye diagram.

FIG. 2 shows an exemplary eye diagram 200 that the system 100 may generate when the system 100 is performing jitter analysis on the input signal 110. From the eye diagram 200, the system 100 can measure some jitter quantities, such as DDj and edge-to-reference time interval error at the nth transition ($TIE_n$), in the input signal 110. Additionally, from the eye diagram 200, the system 100 may also deduce the total jitter and random jitter from the eye diagram 200.

The system 100 may generate the eye diagram 200 by superimposing traces of digitized data samples of a unit interval (UI), such as the duration of a data bit in the communication system under test. For example, the system 100 can plot the input signal 110 against time on a unit-interval axis. At the end of the unit-interval, the system 100 returns to the beginning of the time axis and continue plotting, without removing previously displayed traces. Then the eye diagram 200 can include many overlapping curves. In this example, the eye diagram 200 includes multiple traces 205 of the input signal 110. The eye diagram 200 also includes an expected time 210 of the n-th transition for a jitter free signal at Tn and an expected time 215 of the (n−1)-th transition for a jitter free signal at Tn−1. As shown, the eye diagram 200 includes a predefined voltage threshold 220. If the input signal 110 is jitter free, then the nth transition and the (n−1)-th transitions of the input signal 110 are expected to cross the predefined voltage threshold 220 at times 210 and 215 respectively. The system 100 can determine the $TIE_n$ by comparing an actual transition time of the nth transition and the expected transition time 210. As an example, one of the traces 205a may have an actual transition time 225. The system 100 can then determine that the $TIE_n$ of the trace 205a by subtracting the actual transition time 225 and the expected transition time 215. In some examples, the system 100 may obtain a number of $TIE_n$ from a data sample of the input signal 110 and determine an average $TIE_n$ among the data sample.

From the eye diagram 200, the system 100 can also obtain DDj of the input signal 110. As shown, the system 100 may determine a DDj 230 at the nth transition of the input signal 110, which is the peak-to-peak variation of the transition time.

The system 100 may also determine total jitter of the input signal 110 by analyzing the eye diagram 200. In some embodiments, the system 100 may generate a histogram of the $TIE_n$.

The system 100 can then analyze the histogram and determine the total jitter by, for example, computing the variance of the histogram. Then the system 100 can separate the measured total jitter into $J_H$ and $J_V$ and eliminate the intrinsic jitter from the total jitter. Additionally, the system 100 can also obtain other information from the histogram such as a confidence interval of more than 50% of the measurement will be contained in the interval, expected peak-to-peak value that would be observed for the theoretical number of measurement, or a confidence interval for a specified bit error rate (BER).

The system 100 can also measure random jitter from the eye diagram 200. In some embodiments, the system 100 may estimate RJ as a quantity in a specific probability distribution, such as a Gaussian distribution. Then the system 100 may characterize random jitter by measuring characteristic quantity of the distribution. For example, if the probability distribution of the random jitter is Gaussian distribution, then the system 100 may measure the mean and probabilistic amplitude, such as a variance, of the random jitter distribution as a measure for the random jitter.

In one exemplary embodiment, the jitter contributed by the DO 105 may be dominated by amplitude (vertical) jitter (e.g., due to thermal noise). As such, the intrinsic jitter is primarily vertical jitter, and the horizontal intrinsic jitter may be considered negligible. Also in this example, the jitter on the input signal 110 is dominated by horizontal jitter (e.g., due to quantization noise). As such, the jitter on the input signal 110 is primarily horizontal jitter, and the vertical signal jitter may be considered negligible. In this example, the system 100 may resolve the measured total jitter into horizontal and vertical components according to a method such as that described with reference to FIG. 5. Accordingly, the signal jitter may be estimated to be approximately equal to the horizontal component of the total jitter. In other exemplary embodiments, the intrinsic jitter may be substantially horizontal jitter and the signal jitter may be substantially vertical jitter. Further details are described with reference to FIG. 3.

Figure 3:
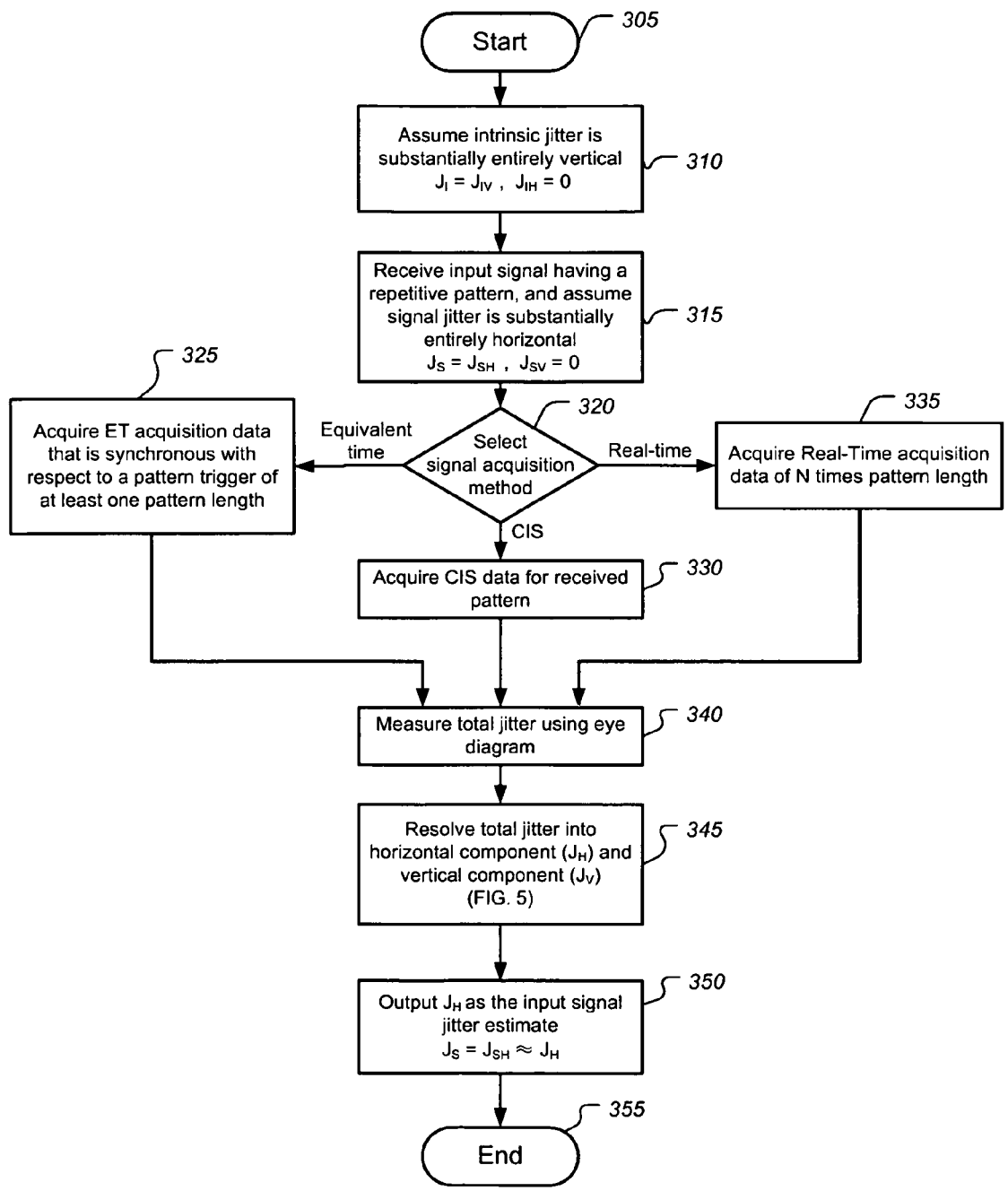
FIG. 3 shows a flowchart of an exemplary method for measuring jitter.

FIG. 3 is a flowchart that shows an exemplary method 300 for measuring jitter in the signal measuring system 100. For example, the method 300 may be performed by the system 100. As an example, the system 100 may execute the method that is implemented as the code 160 in the system 100. The method 300 may begin in step 305 when the system 100 receives a command to determine an estimate of jitter in the input signal 110, which may be a repetitive signal, a NRZ data pattern, or a RZ data pattern, for example.

In step 310 of this example, the system 100 is configured to assume that intrinsic jitter in the signal measurement system 100 is substantially entirely vertical. In other examples, the intrinsic jitter may be assumed to be substantially entirely horizontal. The system 100 may identify the intrinsic jitter, for example, by executing an internal test. In some embodiments, the system 100 may perform a test to measure the noise floor of the signal measurement system 100. In some further embodiments, the system 100 may retrieve results of intrinsic jitter measurements that are stored in NVM 145. For example, the system 100 may retrieve intrinsic jitter of the signal measurement system 100 from the NVM 145 that may be, for example, predefined in manufacturing process, or measured during previous oscilloscope calibration operations. In some embodiments, the system 100 may estimate the intrinsic jitter by resolving intrinsic jitter ($J_I$) into $J_{IH}$ and $J_{IV}$. In another example, the system 100 may identify the intrinsic jitter value by reading predefined values of $J_{IH}$ and/or $J_{IV}$ that were stored in the NVM 145 during a manufacturing process, for example.

Next, in step 315, the system 100 may begin to receive a repetitive pattern, which in this example, may include receiving the input signal 110. In this example, the system 100 is configured to assume that jitter of the input signal 100 is substantially entirely horizontal. In other examples, the signal jitter may be assumed to be substantially entirely vertical. In one embodiment, the fitting may be of a periodic clock, i.e., with a single cycle pattern. In other embodiments, the data may be serial data (e.g., RZ, NRZ).

When the DO 105 is receiving the repetitive pattern, the system 100 may collect data for jitter analysis by selecting a signal acquisition method to in step 320. In some examples, because the input signal 110 is a repetitive signal, the system 100 can acquire data using the ET sampling. If, in step 320, the system 100 selects to use the ET sampling to acquire data for jitter analysis, then the system 100 may acquire data of at least one pattern length with respect to a pattern trigger in step 325. Using the ET sampling, the system 100 can build a picture of the waveform over time, as long as the data pattern repeats itself. As an example, the system 100 may sample the input signal 110 relative to a pattern trigger, such as a rising edge of the clock signal 135. Since the input signal 110 is repetitive, the system 100 may collect data samples by sampling the input signal 110 at different relative positions in the pattern on successive cycles of the pattern.

If the system 100 selects to use the CIS (coherent interleaved sampling) mode to acquire the repetitive data pattern in step 320, then the system 100 may, in step 330, acquire CIS data for the received pattern. In various embodiments, the CIS mode can present a serial data pattern as a superposition of many acquisitions of the same repeating pattern. Without a precise hardware pattern trigger, given only the correct bit rate and pattern length, the CIS may yield substantially phase-synchronized or —invariant data. If the input signal 110 is a fixed repeating pattern of serial data (RZ or NRZ pattern), for example, then the operator may select the CIS mode. As another example, the operator may select the CIS mode when it is required to lock the received repetitive pattern for inter-symbol interference (ISI) and/or DDj analysis. The system 100 may analyze the acquired data to obtain sufficient absolute phase information to present the pattern as expected, and to correlate the noise components with specific bits in the pattern. In some embodiments, the system 100 may perform post-processing operations to restore the sampled data to create a full pattern.

If a bandwidth of the input signal 110 is within the bandwidth capabilities of the system 100, the system 100 may select real-time acquisition in step 320 and acquire real-time acquisition data of N times the pattern length in step 335. For example, the system 100 may acquire a data pattern using a single-shot mode to collect data, such as pattern length, pattern frequency, and pattern content, from a single acquisition. In the single shot mode, the system 100 may only be triggered once to acquire a sequence of samples of the repeating input signal pattern.

After the system 100 samples the received data pattern in step 325, 330, or 335, the system 100 measures total jitter in step 340 by constructing an eye diagram, such as the eye diagram 200, from the collected data. In some embodiments, the system 100 can deduce random jitter and data dependent jitter in the input signal 110 and determine total jitter from the eye diagram 200. For example, the system 100 may generate a histogram from the eye diagram to determine the variance of the TIE (time interval error) in the received data pattern and/or to measure the total jitter in the received data pattern. Next, the system 100 may, in step 345, resolve total jitter into horizontal $J_H$ and vertical $J_V$ components. In various embodiments, the system 100 may resolve measured total jitter into $J_H$ and $J_V$ by correlating the variance of the rate of change of the signal and the variance of measured noise in the signal. An exemplary method for separating total jitter into $J_H$ and $J_V$ is described in further detail with reference to FIG. 5.

In step 350, the system 100 may output $J_H$ as the input signal jitter estimate. For example, the processor 165 may cause information about the result to the display driver 175 for display in text and/or graphical form. The method 300 ends at step 355.

In other applications, information about the horizontal and/or vertical components of the intrinsic jitter may be predetermined, by measurement or by reference to a look-up table, for example. After the system 100 resolves the total jitter into horizontal and vertical components, each component may be further processed by removing the corresponding horizontal and vertical intrinsic jitter components using quadrature subtraction, for example. Thus, having information about the magnitudes of the intrinsic jitter components may be used to refine the estimate of signal jitter components. Further details are described with reference to FIG. 4.

Figure 4:
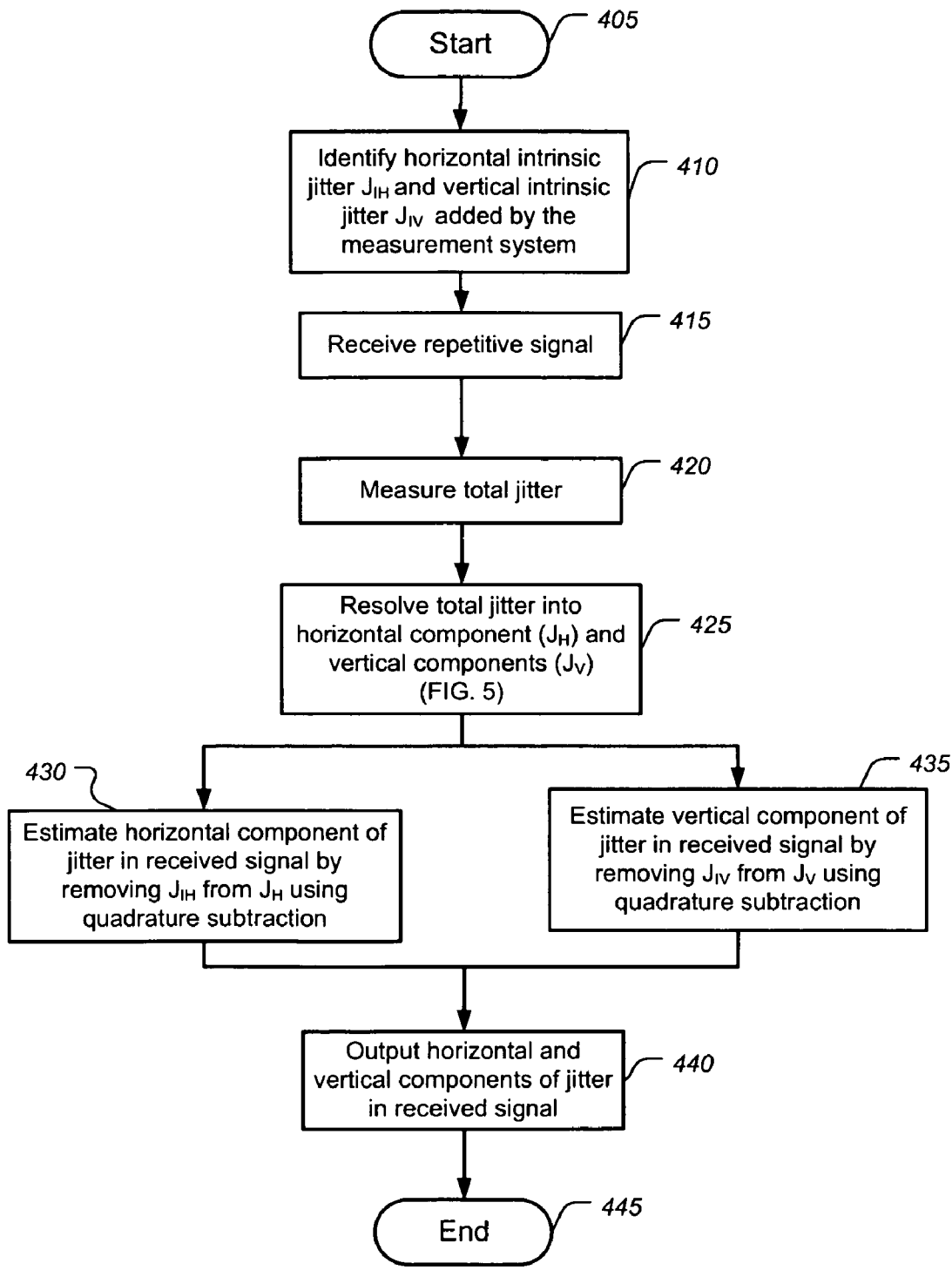
FIG. 4 shows a flowchart of an exemplary method for measuring horizontal jitter and vertical jitter.

FIG. 4 is a flowchart that shows an exemplary method 400 for determining horizontal jitter and vertical jitter of the input signal 110 using the signal measurement system 100. In this example, the system is not configured based on an assumption that the intrinsic jitter is substantially entirely vertical and that the signal jitter is substantially entirely horizontal (or vice versa). Rather, in this example, the system 100 identifies values for horizontal and/or vertical components of intrinsic jitter, and uses those identified values to determine estimates for horizontal and/or vertical components of jitter on the input signal 110. As an example, the system 100 may perform the method 400 when the processor 165 is executing the code module 160.

The method 400 begins at step 405 when the system 100 receives a command to determine horizontal jitter $J_{SH}$ and vertical jitter $J_{SV}$ in the input signal 110. In step 410, the system 100 identifies horizontal intrinsic jitter $J_{IH}$ and vertical intrinsic jitter $J_{IV}$ for the system 100. The $J_{IH}$ and $J_{IV}$ may be determined using methods as described with reference to FIG. 3, for example. Then the DO 105 receives, in step 415, a repetitive signal. For example, the system 100 may receive the repetitive signal and sample the received signal using the ET acquisition method, the CIS acquisition method, or the real-time acquisition method, as described with reference to FIG. 3. In step 420, the system 100 measures total jitter in the input signal 110 using the sampled data. Next, the system 100 resolves total jitter into horizontal $J_H$ and vertical $J_V$ components in step 425. An example method to resolve total jitter into horizontal and vertical components is described in further detail with reference to FIG. 5.

In some examples, the jitter may be substantially random. Using the results of step 425, the system 100 estimates the horizontal component of jitter in the received signal $J_{SH}$ using quadrature subtraction (see Eq. 1) of horizontal intrinsic jitter $J_{IH}$ from the total horizontal jitter $J_H$ in step 430. In step 435, the system 100 estimates the vertical component of jitter in the received signal $J_{SV}$ using quadrature subtraction (see Eq. 2) of vertical intrinsic jitter $J_{IV}$ from the total vertical jitter $J_V$.

$$J_{SH} = \sqrt{J_H^2 - J_{IH}^2} \quad (1)$$

and $$J_{SV} = \sqrt{J_V^2 - J_{IV}^2} \quad (2)$$

Then, in step 440, the system 100 outputs the estimates of $J_{SH}$ and $J_{SV}$ in the received signal. A communication engineer, for example, may use estimates of $J_{SH}$ and $J_{SV}$ to better evaluate the reliability, signal margin, or dependability of a high frequency data channel and/or data path. The method 400 ends at step 445.

Figure 5:
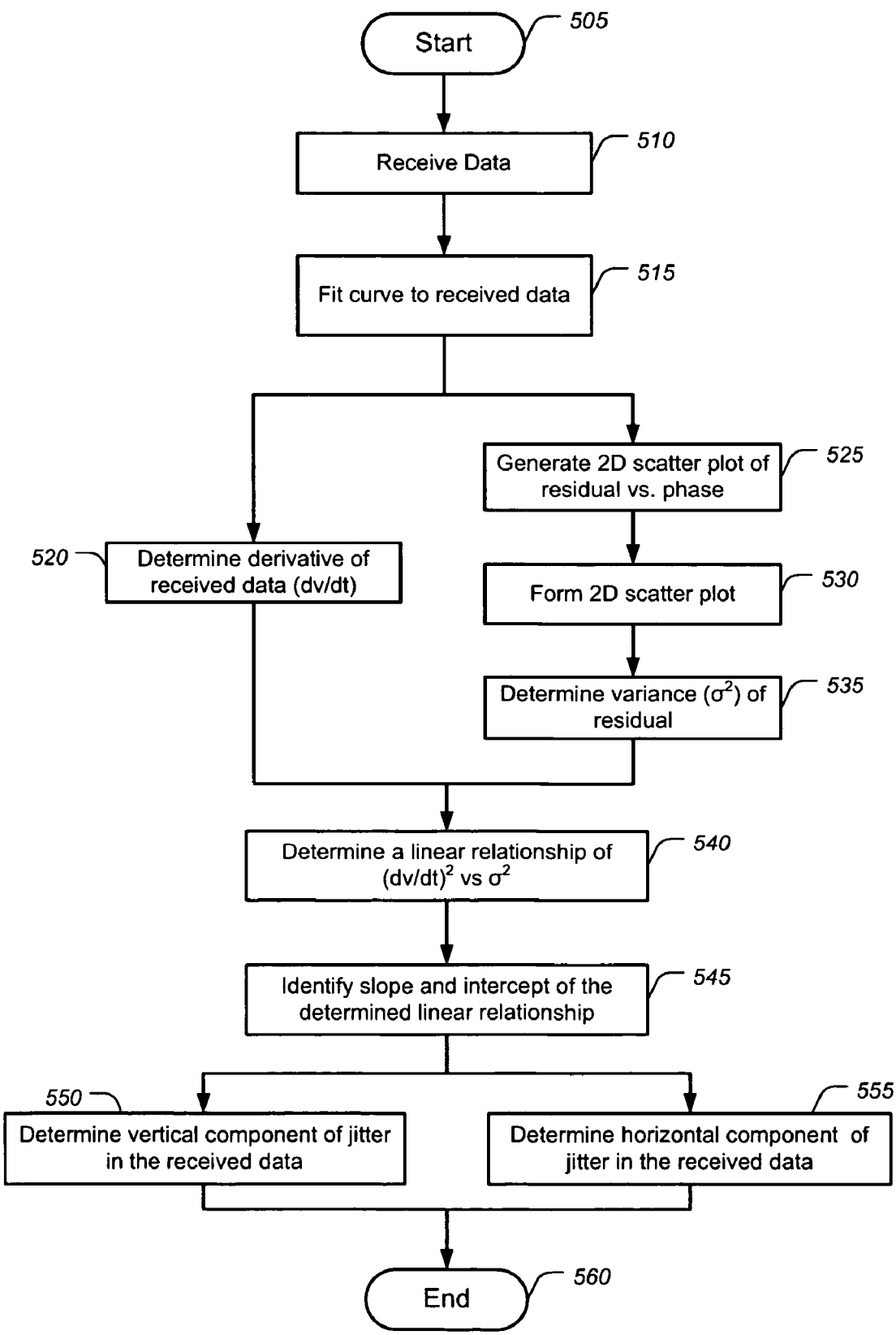
FIG. 5 shows a flowchart of an exemplary method to resolve composite jitter into vertical jitter and horizontal jitter.

FIG. 5 shows a flowchart of an exemplary method 500 that the processor 165 may perform to resolve total jitter into $J_V$ and $J_H$. In some examples, determining $J_H$ and $J_V$ may be based on a number of assumptions. For example, one assumption may be that the jitter processes are stochastic and stationary, and the $J_H$ and $J_V$ are uncorrelated. In one embodiment, the system 100 can use a generated statistical correlation between $\sigma^2$ and $(dv/dt)^2$ to predict the relative proportions of vertical jitter ($J_V$) and horizontal jitter ($J_H$) present in a measured total jitter. In some embodiments, the processor 165 may use the math coprocessor 170 to perform some of the mathematical operations in the method 500.

In this example, the method 500 may begin in step 505 when initiated as a sub-routine, for example, in step 345 of FIG. 3. In step 510, the processor 165 receives data from the NVM 145 or the memory 150. The data may be samples of the input signal 110 acquired by the system 100 using the ET sampling acquisition, the CIS acquisition, or the real-time sampling acquisition. Then, the processor 165 can fit a curve to the received data in step 515 to determine an approximate function f(t) of the input signal 110. For example, the processor 165 may fit the received data using a method derived from first principles using numerical approximation methods, such as Newton's method and simple extremal analysis. In some embodiments, the processor 165 may first fit the received data using a least-square sinusoidal fit algorithm. Using the least-square sinusoidal fit algorithm, the processor 165 may fit the received data into a sinusoidal function and obtain best-fit parameters of the received signal, such as a best-fit fundamental frequency of the signal. Then, the processor 165 may construct the Fourier components of the repetitive signal by determining discrete Fourier sums at each harmonic of the fundamental frequency of the input signal 110s. Each of the discrete Fourier sums yields both phase and magnitude of the corresponding harmonic component. In one embodiment, eleven harmonics may be calculated to reconstruct the periodic signal. In other embodiments, the processor 165 may also compute between two and at least about twenty or more harmonics, depending on the accuracy and processing time requirement for the curve fitting operation.

Once the processor 165 determines all the required harmonic terms, the processor 165 determines a derivative of the received data (dv/dt) in step 520 from the fitted curve. An example of the dv/dt of the input signal 110 will be described in further detail with reference to FIG. 6A.

The processor 165 may, in step 525, determine periodic residuals of the fitted curve to generate a 2D scatter plot of residual vs. phase for an entire bit period of the original signal. In some embodiments, the processor may compute the periodic residuals ($r_k$) at each sampling time ($t_k$) using the following equations:

$$r_k = y_k - f(t_k) \quad (3)$$

where $y_k$ is the actual measured signal voltage level at time $t_k$. Then, the processor 165 accumulates the periodic residuals into a persistence map, which is stored as a 2-dimensional array, to form a scattered plot in step 530. In one example, the processor 165 may generate the scatter plot by first determining for each $t_k$ a corresponding phase angle, from 0 to $2\pi$, of the fundamental frequency. In some embodiments, the processor 165 may compute an angle, where $2\pi$ may represent the time of a full period of the fundamental frequency, of each $t_k$ and modulate the angle by $2\pi$. For example, the processor 165 may be configured to compute the angle by:

$$\phi_k = \omega \cdot (t_k + \phi_0) \quad (4)$$

where $\phi_k$ is the corresponding angle, $\phi_0$ is the starting phase that may be obtained from the best fit curve, $\omega$ is the fundamental frequency, and $\Delta t$, which is the duration of a sampling interval, or the time between adjacent samples $t_k$. Then the processor may modulate $\phi_k$ by $2\pi$ to determine the phase angle corresponding to $t_k$.

In the persistence map, the processor 165 may define each column of the array to be a range of angles between 0 to $2\pi$. The processor 165 may also define some number of rows for the observed range of residuals. In other words, the processor 165 may form a scattered plot by plotting $r_k$ in the vertical axis against modulated phase angle in the horizontal axis. The persistence map is described in further detail with reference to FIG. 6B.

In some embodiments, all the periodic residuals may be accumulated into the persistence map. The fitting procedure may promote proper phasing. Thus, a large amount of data can be accumulated and the processor 165 may perform statistical operations to characterize noise relative to the shape of the received data.

Next, the processor 165 can determine variance of residual ($\sigma^2$) in step 535. In some embodiments, the processor 165 may generate a histogram for each column in the scatter plot. Then, for each histogram, the processor 165 can determine the variance of the distribution in the histogram. In other embodiments, the processor 165 may first calculate the mean for each column of the scattered plot. Then the processor 165 may calculate the variance for each column using standard statistical definition of variance.

After the processor 165 determines dv/dt in step 520 and $\sigma^2$ in step 535, the processor 165 determines, in step 540, a linear relationship between $(dv/dt)^2$ and $\sigma_2$. In some embodiments, the processor 165 may first determine $(dv/dt)^2$ at each phase angle from 0 to $2\pi$ corresponding to each $t_k$, similar to the phase angle modulation operation performed in step 525. Then, the processor 165 may perform a linear least square fit using $(dv/dt)^2$ and $\sigma^2$ pairs at each phase angle. In some embodiments, the determined linear relationship, such as the result of the linear least square fit or other linear regression method, may result in a linear function of the form $$\sigma^2 = m \cdot (dv/dt)^2 + b \quad (5)$$

where the "best fit" parameters m and b may be obtained from the fitting operation.

Next, in step 545, the processor 165 may identify slope and intercept of the determined linear relationship. For example, in equation (4), the processor 165 can identify that the slope is the best-fit parameter m and the intercept of the equation (4) is the parameter b. Then, the processor 165 can determine a vertical component of jitter in the received data in step 550 and determine horizontal component of jitter in the received data in step 555. In some embodiments, the processor 165 may use a statistical correlation of time dependent noise and time independent noise in the following form.

$$\sigma^2 = \sigma_v^2 (dv/dt)^2 + \sigma_h^2 \quad (6)$$

Thus, the identified slope, m in (5) or $\sigma_v^2$ in (6), gives a measure of the $J_V$, which is timing independent noise. The intercept, b in (5) or $\sigma_h^2$ in (6), yields a measure of the $J_H$, which is timing dependent noise. In one example, the processor 165 may output the $\sigma_v^2$ and $\sigma_h^2$ as a direct result. In other examples, the processor 165 may convert the quantity the $\sigma_v^2$ and $\sigma_h^2$ into other quantities, such as bit error rate or confidence level, and output the converted quantities. After the vertical and horizontal components of jitter are determined, the method 500 ends at step 560.

Figure 6A:
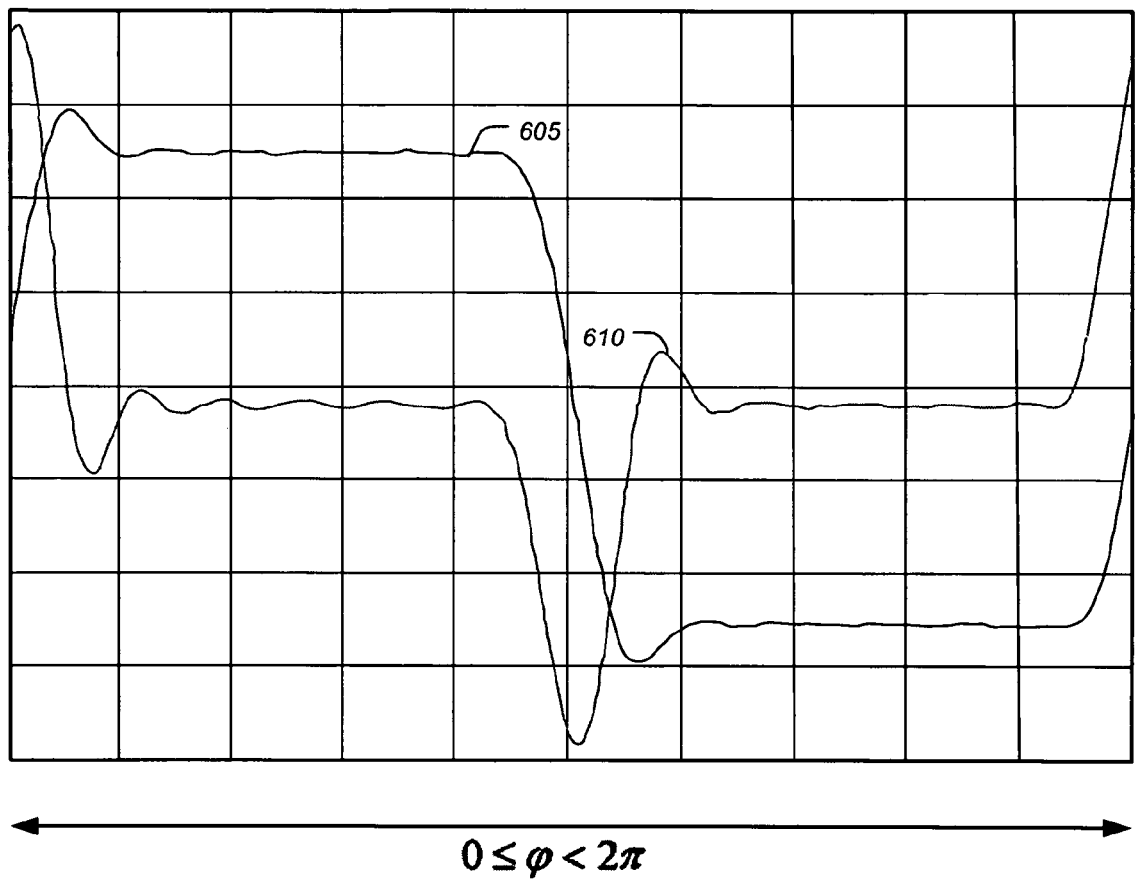
FIG. 6A-6C are displays showing the exemplary intermediate outputs of a DO when the DO is resolving a composite jitter into horizontal component and vertical component of the composite jitter.
Figure 6B:
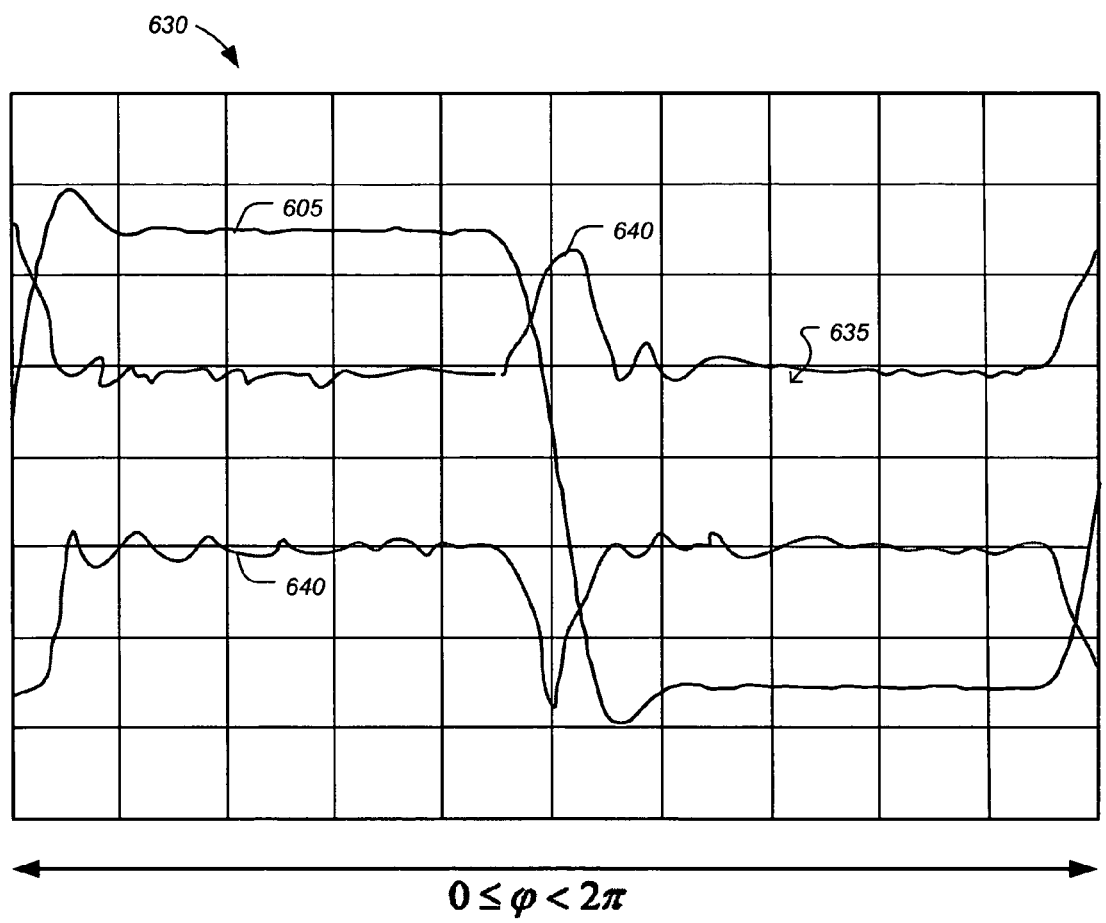
Figure 6C:
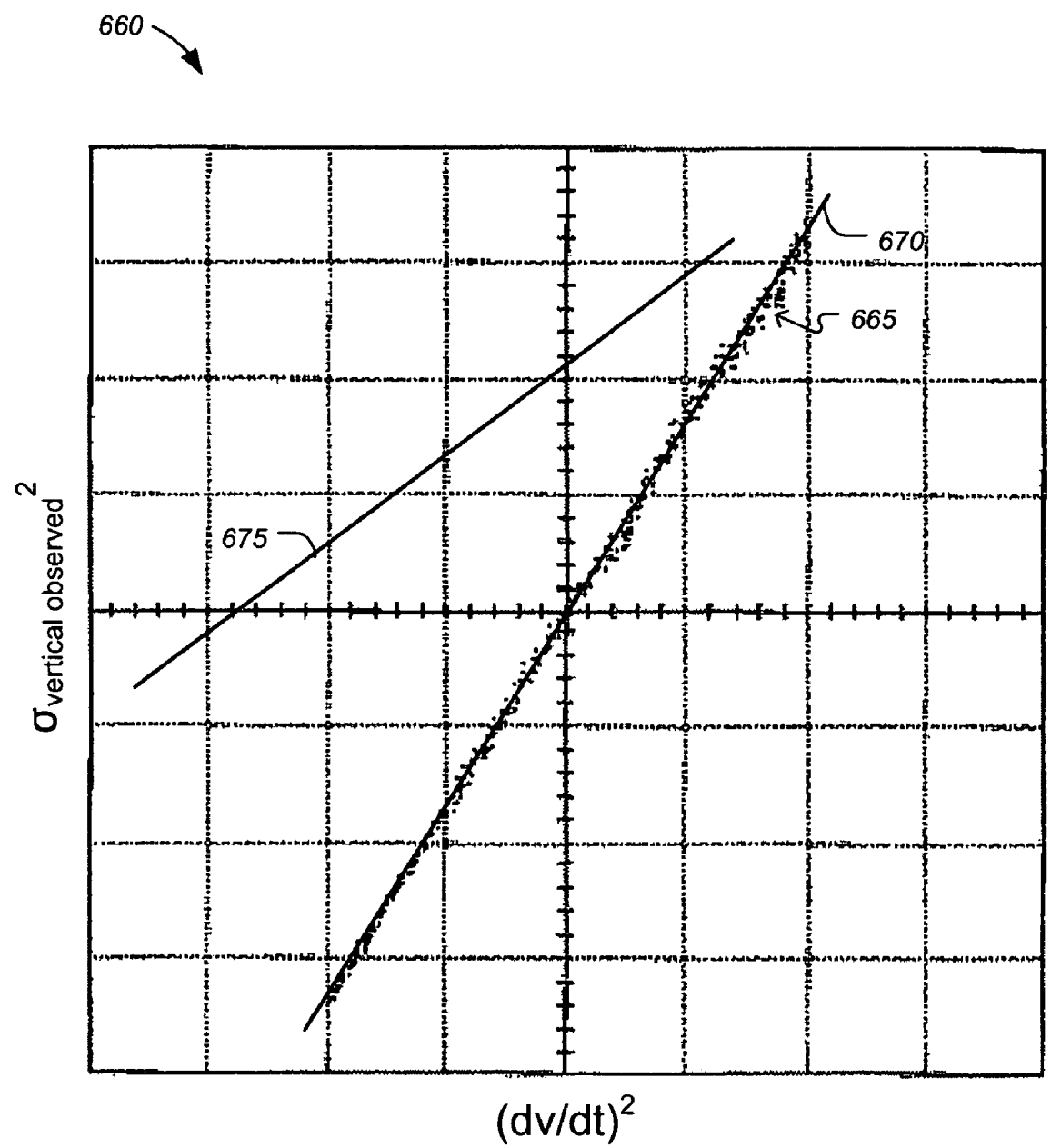

The method 500 for resolving total jitter into $J_V$ and $J_H$ may be described graphically according to FIG. 6A-6C, which shows plots of exemplary intermediate outputs of the system 100. In some embodiments, the system 100 may determine dv/dt, form a 2-dimensional scattered plot of periodic residuals, and generate a plot of $(dv/dt)^2$ vs. $\sigma^2$ before obtaining the statistical relationship between the variance of the residual ($\sigma^2$) and the rate of change of the input signal (dv/dt). Referring to FIG. 6A, a display 600 of the system 100 shows a trace 605 of a reconstructed periodic clock waveform and a trace 610 of the rate of change for the reconstructed clock signal. In some embodiments, the waveform may be reconstructed from a substantially periodic clock, for example. In some other embodiments, the waveform may be reconstructed from a 2D scatter plot representation of a serial data signal having a repetitive pattern. In such embodiments, the same method may be used to obtain dv/dt for a plurality of horizontal phases in the pattern.

In the display 600, the horizontal axis represents phase angles from 0 to $2\pi$, which may represent relative time in a period of the input signal 110. As shown, the system 100 is displaying a full period of the trace 605. In some embodiments, the processor 165 may fit a curve to the received input signal 110 by computing the discrete Fourier sums of the fundamental frequency and the harmonics of the input signal 110. The processor 165 can reconstruct the input signal 110 from the discrete Fourier sums. In this example, the processor 165 may reconstruct a periodic clock input and displayed on the display 600.

From the trace 605, the processor 165 can determine the trace 610 by, for example, differentiating the fitted curve. In one embodiment, the processor 165 may be configured to differentiate curves that are represented by the Fourier coefficients obtained during the curve fitting operation. In another embodiment, the processor 165 can generate a plurality of data points using the fitted curve and compute dv/dt using the generated data points. For example, the processor 165 may determine dv/dt at each data point by averaging the slope between the data point and its adjacent data points.

Referring to FIG. 6B, an exemplary 2-dimensional scattered plot 630 of the trace 605 is shown. The scattered plot 630 includes an area 635 that includes most of the periodic residuals of the periodic fit at each phase angle between 0 and $2\pi$. After performing the periodic fit, the processor 165 may generate the scattered plot 630 by plotting the periodic residuals at each $t_k$ in the column corresponding to $t_k$, as described with reference to FIG. 5. As shown in FIG. 6B, the scattered plot also includes three sigma boundaries 640. For example, the three-sigma boundaries 640 may show an envelope that the processor 165 determine an approximately 99.73% of the periodic residual may be estimated to lie within the boundaries 640. In other embodiments, the boundary may be more or less than three-sigma, such as between 0.5 and 3 sigma, or from three-sigma to at least about six-sigma, for example. In some embodiments, the processor 165 may determine the shape and position of the envelope by generating a histogram of the periodic residuals at the columns and by computing the variance at each of the columns. Using the variance information and the computed dv/dt in FIG. 6A, the processor 165 can determine horizontal jitter and vertical jitter in the measured total jitter by fitting a linear relationship between $\sigma^2$ and dv/dt.

Referring to FIG. 6C, the system 100 may display an exemplary scatter plot 660 of $\sigma^2$ vs. $(dv/dt)^2$. The scattered plot 600 includes a collection of paired data set 665. As discussed with reference to FIG. 5, the processor 165 may determine the $J_V$ and $J_H$ in the measured total jitter by generating a statistical correlation between $\sigma^2$ and dv/dt. As an example, the processor 165 may use linear regression to determine a best-fit linear equation representing the data set 665, such as an equation of the form of the equation (4), as shown as a line 670. Then, from the line 670, the processor 165 may obtain a slope and intercept, which represent $\sigma_v^2$, and $\sigma_h^2$, respectively. The scattered plot 660 also includes another exemplary line 675 that is a result of linear regression of another example data set. Because the slope of the line 675 is less than the slope of the line 670, the processor 165 may determine that the signal used to create the line 675 may have a smaller horizontal jitter than the signal used to create the line 670. Because the intercept of line 675 is higher than the intercept of the line 670, the processor 165 may determine that the signal used to create the line 675 may have a higher vertical jitter than the signal used to create the line 670.

Although one embodiment of each of the methods 300, 400, 500 has been depicted, other embodiments may perform the steps in different sequence, or a modified arrangement to achieve the same primary function, which is to resolve jitter into horizontal and vertical components.

Although an exemplary signal measurement system 100 has been described with reference to FIG. 1, other implementations may be deployed in other test and/or measurement applications. For example, several of the components (e.g., DMA, memory, math co-processor) on the system 100 may be substantially integrated into one or more integrated circuit packages, ASICs, or modules to provide a digitizing and analysis system capable of determining horizontal and/or vertical components of jitter as described herein. In some examples, an output may include an absolute or relative measurement of horizontal and/or vertical jitter. The output may be in graphical, visual indicator, numeric, or pass/fail format based on a threshold. In some embodiments, the results may be sent for display on a display device.

In various embodiments, apparatus and associated systems, methods and computer program products may relate to measuring jitter to identify orthogonal jitter components. Moreover, components of jitter, such as random, deterministic, and components thereof, such as data dependent, inter-symbol interference, and/or periodic jitter, may be combined or separated using various mathematical and/or analytical tools (e.g., quadrature addition, quadrature subtraction, convolution, statistical analysis) familiar to those of ordinary skill in the art of jitter analysis.

In some embodiments, information about the horizontal or vertical intrinsic jitter may be identified. In some cases, the identified intrinsic jitter information may be used to determine signal jitter directly using quadrature subtraction. For example, after measuring total jitter, signal jitter may be directly determined by quadrature subtraction of the intrinsic jitter if intrinsic jitter and signal jitter are assumed to be substantially orthogonal and random (i.e., Gaussian distributed samples). As an example, if signal jitter is assumed to be primarily horizontal, and if intrinsic jitter is assumed to be primarily vertical, then quadrature subtraction of intrinsic jitter from measured total jitter may yield an estimate of the signal jitter. As another example, if signal jitter is assumed to be primarily vertical, and if intrinsic jitter is assumed to be primarily horizontal, then quadrature subtraction of intrinsic jitter from measured overall or composite jitter may yield an estimate of the signal jitter.

In various embodiments, the system 100 may output a graphical and/or numerical representation of the horizontal and/or vertical components of jitter. For example, the representation may be relative, such as a pie chart showing the relative percentages for the horizontal and vertical signal jitter components for the total signal jitter. In another example, absolute values for horizontal and/or vertical signal jitter may be sent for display on a user interface in graphical and/or numeric formats. Similar representations may be output to indicate the relative and absolute values of the horizontal and/or vertical components of the intrinsic jitter. In another example, the estimated components may be output for display as a function of a specified bit error rate (BER), at one or more user-specified BERs, and/or one or more bandwidths of the channel in the DO 105. An automated acquisitions and corresponding computations may be performed at several different combinations of DO channel bandwidth and BER specifications. For example, horizontal and/or vertical jitter components may be plotted on contour plots as a function of DO channel bandwidth (which may be adjusted electronically using FIR or IIR filters) and as a function of BER.

An acquisition system may include a processor and an associated first memory for storing acquired sample data and a second memory for storing executable instructions that cause the processor to perform operations to resolve components of jitter as described herein.

A jitter measurement apparatus, such as a digital oscilloscope, sampling scope, or digital storage oscilloscope, may be calibrated by providing a grounded input signal (or other stable voltage source on an input channel. Such an input configuration may be automatically configured using relays and/or semiconductor switches. While no signal is being measured, such as when the measurement system is being manufactured or re-calibrated, or during idle time, for example, a substantially jitter free or characterized jitter reference signal may be acquired to determine the components of the intrinsic jitter added by the channel and/or the digital oscilloscope itself. This information may be stored in a non-volatile memory (e.g., flash, disc drive) for use in better identifying components of jitter on an input signal being measured.

In some applications, the system may further determine random amplitude (noise) and/or random jitter. In some further applications, the system may also determine random and/or deterministic phase noise (i.e., horizontal jitter). For example, the system may have the capability to determine random jitter and separately determine data dependent jitter. Such information may be used or displayed in combination with determined information about the lumped horizontal and/or vertical.

Some embodiments further implement a fixed-normalization Q-Scale algorithm (sometimes including transition density), where the Q-Scale includes an alternative scale for expressing cumulative distribution functions (CDF) or Symmetric Cumulative Distribution Function (SCDF) as a function of Q rather than as a function of BER as follows:

$$Q(BER) = CDF_{Gaussian}^{-1}(BER/2) \quad (7)$$

In some embodiments, an exemplary benefit of this vertical scaling for the CDF is that the CDF appears as a triangle or pyramid for a normal Gaussian distribution. Some embodiments may include normalization factors (or normalization parameters) to provide a "renormalization of the Q-Scale." For example, using a normalization factor $\rho_{norm}$, the Q-Scale may advantageously be normalized through a linear modification of the definition (above), such that for a "normalized Q-Scale":

$$Q_{norm}(BER) = CDF_{Gaussian}^{-1}(BER/(\rho_{norm} \cdot 2)) \quad (8)$$

This may provide, for example, a preferred coordinate system for viewing distributions consisting of multiple Gaussian contributors when the value of $\rho_{norm}$ is adapted to the distribution under analysis. In various examples, summing an observed distribution (e.g., histogram) to obtain populations of observed events to the right and to the left of certain bin coordinates may be referred to as an empirical distribution function (EDF). Exemplary procedures described herein may be performed to determine an EDF and/or a symmetric empirical distribution function (SEDF), which may be used to predict a SCDF. In some applications, distributions may be viewed to immediately reveal (e.g., by visual inspection of a plot on a display device) whether a Gaussian component is dominating the distribution. If, for example, a strength 0.2 Gaussian component dominates the left tail of the EDF, then embodiments of the described methods may be used to determine the normalization factor of 0.2, the position of the Gaussian component, and its sigma.

In some embodiments, the "normalized Q-Scale" and a method of obtaining the normalization factor, $\rho_{norm}$, can be used to reveal the behavior of the extremes of the CDF ($Q_{norm}$). Understanding the behavior of the extremes may be advantageous for accurately predicting error rates (e.g., for a broad class of signals), or in predicting how often a timing or voltage measurement exceeds some real or arbitrary requirement or specification (e.g., threshold of time, amplitude, rate, or the like).

According to some examples of the Q-scale algorithm, a "normal" single Gaussian behaves linearly, and other more complex arrangements, including the "Dual Dirac" convolved with a single Gaussian, may behave substantially linearly when an appropriate $\rho_{norm}$ factor is introduced. As an example, a normalization for which the Q-Scale representation of the CDF behaves linearly is $\rho_{norm} = \frac{1}{2}$. An exemplary embodiment of a method follows.

First, a set of elements to be fitted is formed with 3 values: a vertical (Q-Scale) value, a horizontal coordinate (e.g., time for the case for measuring jitter, though the method may be extended to vertical noise analysis, or other suitable variable), and an associated error. Statistically, the error of the input variable $\Sigma p_n$ is furnished as the square-root of the total population of observations (the same sum) contributing to the estimate (of CDF in the case). Upper and lower values of BER are obtained for these variations, and a weight inversely proportional to the variation is assigned to the data point.

The Q-Scale normalization factor is varied over a range of plausible values. In some examples, a normalization factor that fits the generated normalized Q-scale to a linear behavior may be selected. Scaling the probability using a normalization factor selected to substantially linearize the CDF may yield an intercept (with $Q_{norm}(BER)=0$) for the right-hand-side and the left-hand-side of the $CDF(Q_{norm}(BER))$. This intercept value may be interpreted as the mean-value associated with the noise/jitter contributor, and sigma being substantially equal to the reciprocal of the slope obtained from the best linear fit, and amplitude equal to the normalization factor.

Once the observed CDF(Q) and Symmetric CDF (SCDF) have been obtained, a scan over plausible values of rho are scanned (e.g., using a linear, binary, or golden section search), to obtain a "best" fit for the right hand-side and a best fit for the left-hand side (or alternatively a best overall fit). Then, the magnitude, sigma, and offset/mean associated with the dominant contributor to the right and left sides of the distribution's behavior may be predicted.

Figure 7:
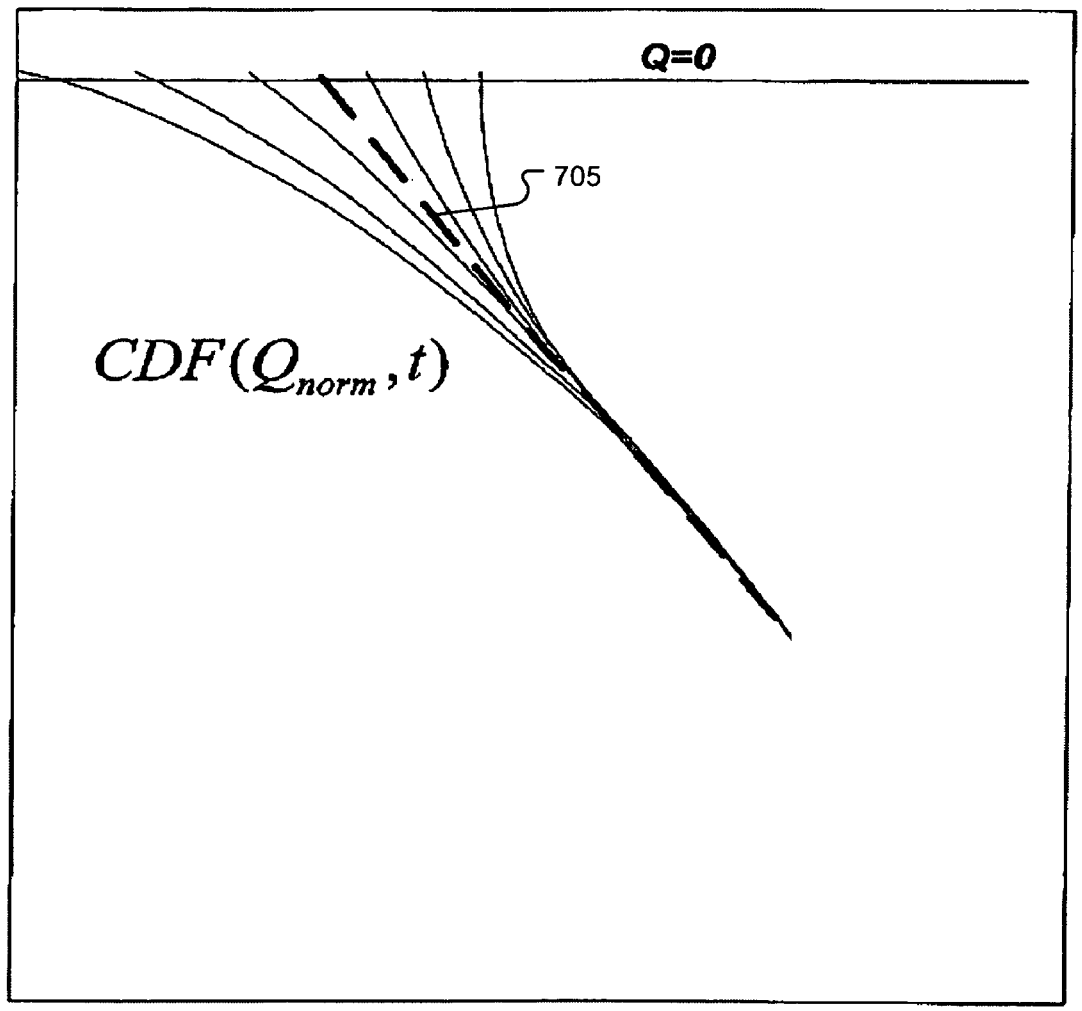
FIG. 7 illustrates exemplary plots for a range of Q-scale normalization factors.

FIG. 7 is a graph showing exemplary results generated by using different normalization factors to scale a CDF. In the depicted example, intercepts at the right-hand-side of the $CDF(Q_{norm}(BER))$ are shown. A normalization value may be found by obtaining the value of rho for which the lowest Chi-square over the largest populated region, not depassing Q=0, is produced. Varying the normalization factor from 1 to epsilon may obtain for the large percentile, large population "fit" a chi-square that reflects the "quality" of the fit. Other figures of merit could be used, with similar results, such as the maximum absolute error divided by the error associated with the data point, or a value proportional to the weight associated with the point contributing largest error, for example. In the depicted example, a normalized factor producing a linear CDF($Q_{norm}$,t) 705 up to the line Q=0 may be used. Under the assumption of symmetric noise/jitter contributions, a single optimal normalization may be obtained and used. However, both extremes of the CDF can be treated independently, yielding strengths ($\rho_{norm}$) and sigmas (1/slope) that may characterize the extremal behavior of each side of the CDF distribution.

The method of this example yields the nominal values of Dj($\delta\delta$) (deterministic jitter) from an analysis of the largely populated portion of the observed distribution. The further refined value of Rj (random jitter) may be obtained from the detailed behavior of the last extremal fraction of the distribution.

In an embodiment, the method may provide a simple and straightforward determination of an optimal Q-Scale normalization for a distribution under analysis. The method may, for example, reveal the dominant extreme (right and left) behavior of the distribution as Gaussian contributors with known mean(s) and (probabilistic) amplitude(s).

In some examples, these estimates of contributors may be shown to be substantially accurate and precise with respect to Monte Carlo generated statistical distributions. Complex distributions may yield an effective Gaussian distribution with reduced "strength" indicated by the selected $\rho_{norm}$ found as a result of embodiments of the method.

Figure 8:
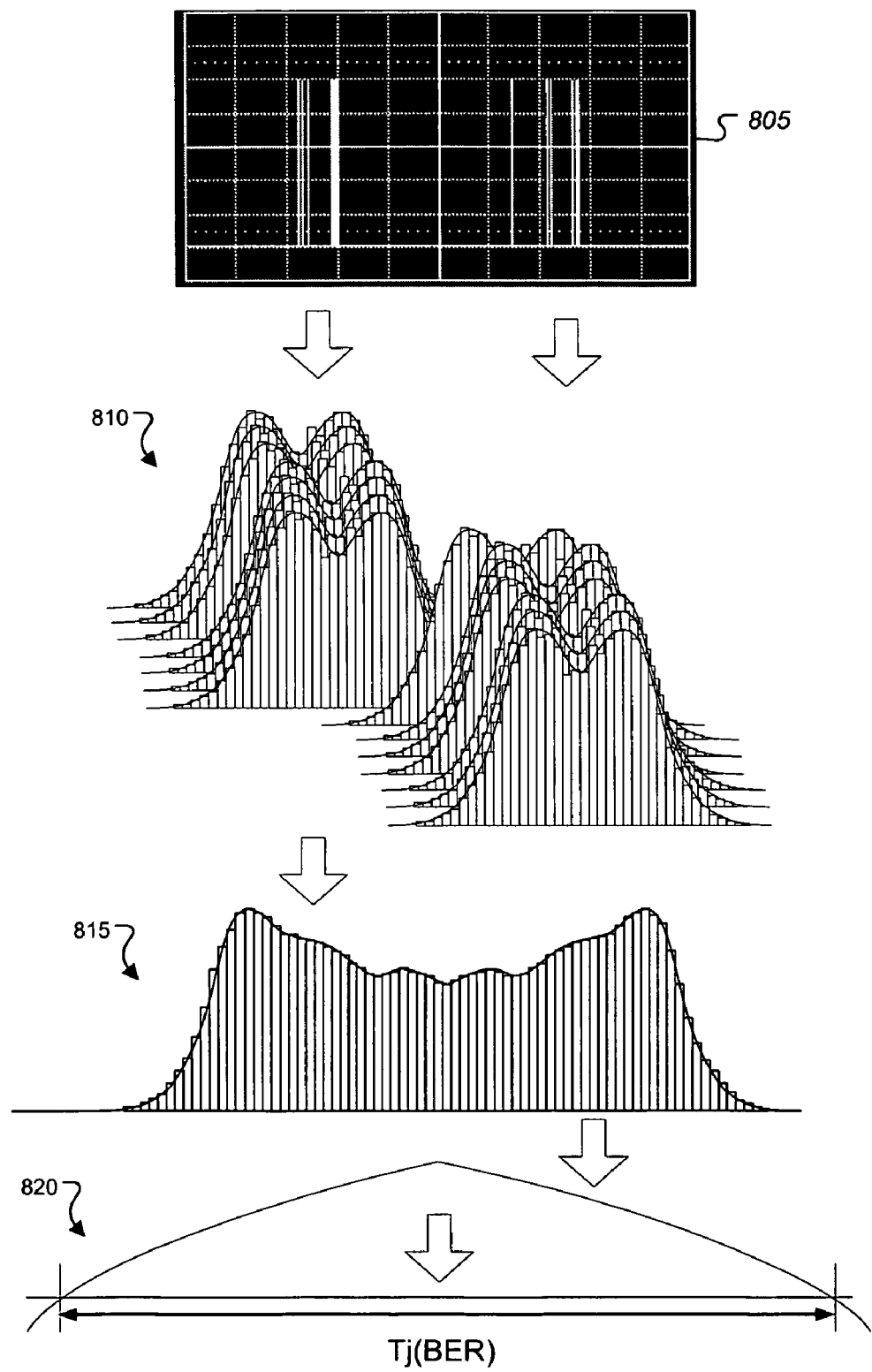
FIG. 8 illustrates exemplary method for performing a normalized Q-scale analysis.

FIG. 8 illustrates exemplary information that may be generated at various process steps in an exemplary method 800 for performing a normalized Q-scale analysis.

In an illustrative example, an oscilloscope (e.g., the DO 105) may use the normalized Q-Scale algorithm 800 to obtain accurate estimates of jitter for a waveform with a repeating pattern. The DO 105 may receive input signals having a repeating pattern. For example, the received input signals may be non-return to zero (NRZ) two-level (i.e., binary) data streams with a repeating data pattern and a synchronous clock. The method 800 may be performed without knowing the pattern in advance of receiving it. In some implementations, a synchronous clock may be used to divide down a basic clock rate to a desired clock rate for acquiring the repeating data pattern. In some examples, the clock may be scaled down by a divider to a reduced clock rate using, for example, a prescaler. In some examples, the input signals may be an NRZ data stream for which may be a known or an unknown repeating pattern.

In some examples, jitter measurements in an oscilloscope can either be configured manually before enabling the jitter measurement, or set semi-automatically using, for example, the "Check Scope Setup" button. In one example, the DO 105 may be configured in a CIS acquisition mode and the correct synchronization signal specified in the trigger dialog. Settings for a CIS acquisition may include PLL Bandwidth "High" and Samples per UI=1024 or 2048. A digital oscilloscope time base may be set to a minimum (e.g., 10 divisions) which may allow, for example, for more than 2 repetitions of the repeating pattern.

In some implementations, if the total number of points acquired in order to meet the above requirement is less than, for example, 1 million points, then the time base setting may be increased to have around 1 million points to improve efficiency. The number of points used may vary widely (e.g., from less than about 10,000, to about 100,000, up to about 10 million, or up to at least 100 million or more). The actual number of points selected may depend on, for example, on desired accuracy, available time and/or processing capability.

During a measurement process, the input signals under test may be "signal averaged," for example, for up to at least 10,000 sweeps. Using the signal averaged data, the oscilloscope may reconstruct an averaged waveform of the input signal. Using the acquired input signals, a processor (e.g., the processor 165 or the math coprocessor 170) of the oscilloscope may perform an edge displacement calculation.

For example, the processor responsible for the edge displacement calculation may also be responsible for detecting and recording the repeating pattern of data. In some systems, this calculation is performed on the averaged waveform. A signal with a large Pj, ISI, and/or vertical noise may be referred to as a signal with a "highly stressed" eye. Detecting correct bit patterns in a signal with a highly stressed eye may call for use of a robust algorithm.

In some implementations, the CIS acquisition may provide a lock to a pattern in the input signals, allowing an average response to be formed, even without having detected the pattern. The pattern detection may involve learning a reasonable threshold (e.g., about a mid-point of the signal's vertical span), and identifying transitions or edges in the sequence of data (e.g., by using some (smallish) hysteresis).

When the edges are detected, the classical method used for real-time oscilloscopes may be applied. In some implementation, this method may include the following steps. A first step involves detecting all edges in the data sequence. A second step involves determining the bit values (the precise NRZ decode) in the input waveform. A third step involves synchronizing to the data pattern requested (or found). A fourth step involves comparing a time from a first edge to a subsequent edge in the pattern, and calculating, for example, $\Delta t_n = (t_n - t_0) - M \cdot \tau$. In some examples, M could be replaced by n for a clock. M may be the number of period intervals between the two observed edges $t_n$ and $t_0$, where the subscript n, denotes each observation starting with zero and counting forward. In some exemplary data streams in which there is no data transition, the numbers n and M can get out of step. In some examples, there may be fewer edge displacement values than UI's in the repeating pattern length.

The edge displacement values may be used in a number of ways. For example, a peak-to-peak variation of the edge displacement may be reported as DDj (Data Dependent Jitter). In another example, the distribution of the edge displacement may be displayed as a DDj histogram. The effect of a distribution on Tj (total jitter) is typically not simply additive. In another example, the distribution of edge displacement values may be used to create the system's constructed PDF for final estimation of Tj(BER) or Tj(Q).

In some applications, the procedure for measuring jitter in repeating pattern may effectively remove inter symbol interference (ISI) effects and provide for evaluating the remaining jitter for the individual edge transitions, possibly independently from the edge displacement problem. However, in some applications, there may be a remaining effect to account for to improve the precision of jitter measurements in the presence of large ISI. Even though the edge displacements of offsets between the distributions contributed by each edge in the pattern sequence are "removed", the fact that the various bit transitions have different histories may mean that the edge displacements have different rise times, for example, or different trajectories while crossing the threshold level. In some cases, ISI may produce different trajectories that may translate the vertical noise sensitivity of an equivalent receiver or the receiver under test onto different Rj distributions. In some implementations, the DO 105 may use embodiments of the methods 300, 400, 500 to separate, to reduce, and/or to remove the effect of vertical noise from the horizontal jitter distribution. In some examples, the effect of vertical noise from the instrument may be "compensated" by reducing the value of Rj (or sigma) obtained by this method, and thereby obtaining a more accurate estimate of the distribution's behavior in the extremes.

In various embodiments, procedures for measuring jitter in repeating patterns may be performed in parallel to collecting a very large database of persistence data for as much as possible of the repeating pattern. In one example, maximum memory consumption may be limited to about 128 Mbytes of DRAM. One example implementation may include up to 31 UIs at 2048 columns per UI. In other examples, the DO 105 may measure over a larger number of edges using perhaps lower horizontal resolution, or conversely using more memory. Some examples of collecting edge data are described in further detail below.

An exemplary edge data collection process may include collecting many large CIS acquisitions and re-organizing them into a wide persistence map. The persistence map can be, for example, up to at least about 65 k wide. In some examples, the size of the persistence map may be, for example, a power of two in overall width. In some embodiments, the maximum number of UIs that are recorded from the acquisition may be limited to 32 UI's with 2048 columns of persistence data, for example.

To analyze the 2-dimensional persistence map (PMap), an oscilloscope may proceed, in one example, by scanning all vertical columns of the PMap to determine where the edges occur. For example, the edges may be determined by finding where the distributions are contributing to the vertical band (crossing zone). Once these zones are determined, then a composite histogram may be formed for each such zone. Then, overall detected edges in the histograms for the different edges may also be combined to provide a single histogram for analysis. An exemplary method for generating a composite histogram may be summarized as follows:

a. Edge detection and locating the Zones of Interest;
b. Assembly of multiply histograms from all of the slices of the Zone of interest into a single histogram (see, e.g., FIG. 8), by superposing the histograms at their respective mean horizontal coordinate.
c. The histograms for each "edge" are combined to form a single histogram.

In an illustrative example, a CDF is obtained through integration of the composite PDF (e.g., the single histogram from the previous procedure), first from left to right, then for each element following the median (first bin to exceed 0.50 of the total population or total sum), replace these values with the total population minus previous summed value. This yields the Symmetric Cumulative Distribution function or SCDF.

Next, the oscilloscope may translate the SCDF to the Q-Scale and the normalized Q-Scale for each probability associated with each bin or coordinate in the SCDF. The Q-Scale value used to associate with each probability p is:

$$Q(p) = CDF_G^{-1}\left(\frac{p}{2 \cdot \rho_{norm}}\right) \quad (9)$$

Next, the oscilloscope may determine data values included in the fit by using the minimum of: a specified maximum number of points and a maximum percentage of the total population. In one example, these limits may be 10 k points and 2% of the total population such that a maximum of 10 k points or bins in each extreme can be used to meet this requirement. The 2% limit assures that even for a distribution of a couple of thousand events total population there is nonetheless some data to fit. In some implementations, one additional constraint that values of Q<0 (or p>0.5) are excluded from the fit may be added.

In some embodiments, linear fitting and error-based Q-value weighting may be performed using two independent data sets from the right and left of the analyzed SCDF(Q) distribution. This fitting may be standard weighted linear regression. For weights, since no numerical solution to the inverse CDF exists, we use a numerical value calculated as such:

$$1/\Delta_i = 1 \Big/ \left( \begin{array}{c} \left(Q\left(\left(N_i + \sqrt{N_i}\right)/N_{total}\right) - \right. \\ \left. \left(Q\left(\left(N_i - \sqrt{N_i}\right)/N_{total}\right)\right) \end{array} \right) \quad (10)$$

To avoid the case of the Q(p<0) case, the following substitution may be made:

$$1/\Delta_i = 1/(2Q((N_i+\sqrt{\sqrt{N_i}})/N_{total})) \quad (11)$$

Automatic determination of a normalization factor may be performed based on experience and observation. For example, to assure the best match to linear behavior, the maximum number of points may be set to 100M and the percentage to 45% (internally). In some examples, this may assure that a large portion of the shoulders is used for the fit.

In some examples, a series of fits may be performed over a range of $\rho_{norm}$ from 1.0 to 0.020 in equal steps. The fits may be performed on both sides of the SCDF distributions. For each normalization setting, sums of the left and right chi-squares (weighted) are recorded. The natural normalization of this dataset is then (to within the step size) the one with the lowest cumulative chi square. In some other examples, the normalization factor may be adjusted according to various search techniques (e.g., exhaustive, golden section search, binary search, or the like) to determine an optimal value.

In some embodiments, a constraint Dj>=0 may be provided to reduce user confusion. Other constraints may be applied, further reducing the $\rho_{norm}$ in small steps until the condition $\rho_{norm}$>=0 is met.

Rj(δδ) and Dj(δδ) may be determined from two linear fits. Rj(δδ) is given by the average of the left and right reciprocal slopes. Each fit on Q-Scale gives a sigma value, which is the reciprocal of the absolute value of the fitted slope on Q-Scale.

$$Rj(\delta\delta)=\sigma=0.5/|slope(CDF_L^{-1}(Q)|+0.5/|slope(CDF_R^{-1}(Q)| \quad (12)$$

$$Dj(\delta\delta)=CDF_R^{-1}(Q=0)-CDF_L^{-1}(Q=0) \quad (13)$$

In some cases, Dj(δδ) may less than or equal to zero. For some cumulative distributions observed on the Q-Scale, the intersections of the lines with Q=0 are negative.

FIG. 8 shows an exemplary embodiment for convolving a predicted PDF with a DDj histogram to yield Tj. In one embodiment, one very wide PDF may be formed by using the central regions (non-fitted) of an original distribution, and extrapolating its tails using a Gaussian of the prescribed mean and sigma on each of the right and left sides. As shown in FIG.

8, edge displacements are shown in a display 805. In some examples, the edge displacements (from above) are recorded as a list of offsets.

From the edge displacements, histograms 810 may be reconstructed for each edge using differences obtained from the mean offset. For example, each edge in the data sequence can be analyzed, and each may be found to have some (usually non-zero) offset for the "mean" of the distribution. The offset may be the difference between the mean and it's expected value (e.g., in the absence of intersymbol interference). Such offsets may be recorded, and the histograms may be summed with the offsets removed by shifting the horizontal of the histogram such that the new mean is exactly zero. In this example, the histograms 810 are summed into a "convolved" PDF 815 with same resolution. In some embodiments, a CDF can be obtained by integrating the PDF 815 (e.g., by summing the populations of the bins) from the left to the right. The CDF may then be translated into a SCDF 820 by treating all bins to the right of the median value. Generally, such treatment may include, for example, summing the populations to have a total population either to the right of some bin coordinate or to the left of some bin coordinate. In some applications, for example, all values in the CDF may be subtracted by half the total population from the CDF. In some embodiments, the SCDF 720 may be generated by summing the CDF from the left and then from the right, independently.

In some embodiments, transition density and the level for the Tj calculation at a given BER are calculated from the final composite SCDF 820 as the width of the SCDF 820 is at BER/($2\rho_{tx}$).

Figure 9:
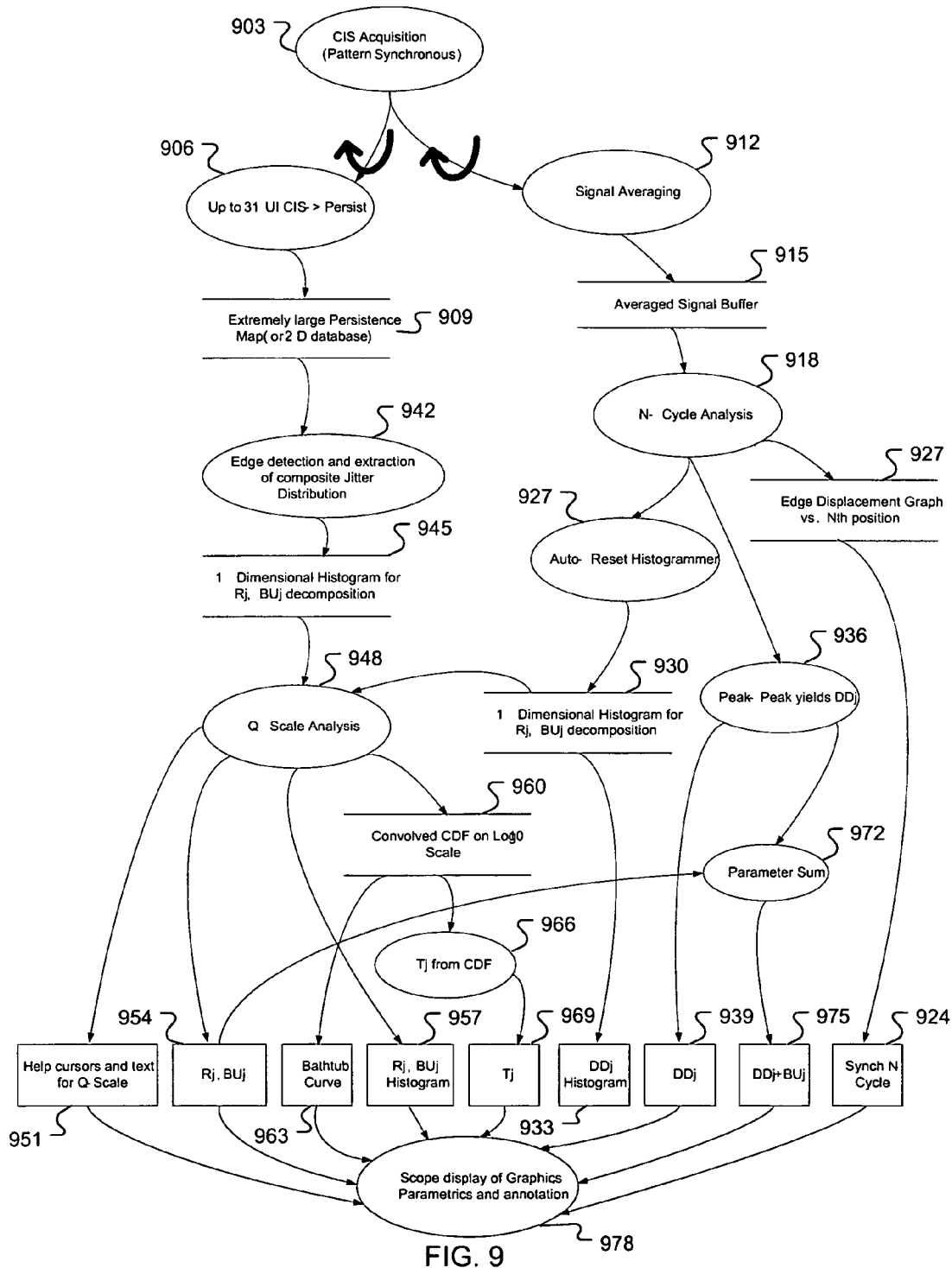
FIGS. 9-10C illustrate an exemplary analysis of signals with repeating patterns.

FIG. 9 is a data flow diagram that illustrates an exemplary method 900 for analyzing jitter in a signal with a repeating pattern. For example, an oscilloscope may use some or all operations of the method 900 to perform the normalized Q-scale algorithm and/or measure jitter of the input signal. The method may be performed, for example, by one or more processors executing instructions that may be retrieved from one or more data stores, such as a register, buffer, cache, RAM, ROM, NVRAM (non-volatile memory), or other data storage device (e.g., hard disc drive, optical drive, and the like). The processor executing instructions may cause operations to be performed, for example, by generating signals. Processors may perform operations by cooperation with analog, digital, and/or mixed-signal circuitry, including ASICs.

The method 900 begins when the oscilloscope performs CIS acquisitions for a number of sweeps to collect data from the input signals in step 903. For example, the oscilloscope may perform CIS acquisition for 10 k sweeps.

After step 903, up to 31 UIs are used in step 906 to generate an extremely large persistence map 909 (e.g., 2D database).

Also after step 903, signal averaging, in step 912, may generate an averaged signal buffer 915. Using the averaged signal buffer 915, the oscilloscope performs an N-Cycle analysis in step 918 to generate an edge displacement graph vs. Nth position 921. In an exemplary implementation, this may be used to obtain edge displacement (e.g., which may be the mean offset) for each edge as a function of N. Using the edge displacement graph vs. Nth position 921, a synch N-cycle 924 can be generated. In some applications, the timing errors, edge displacements, and/or mean offsets versus position or N in the data sequence may be stored and/or graphically presented to an operator on a display device, for example.

After the N-cycle analysis is performed in step 918, an auto reset histogrammer generates, in step 927, a 1 dimensional histogram for Rj, BUj (bounded, uncorrelated) decomposition 930, which can be used to generate a DDj histogram 933. In step 936, peak-peak value from the N-cycle analysis in step 918 yields a DDj 939.

Additionally, using the extremely large persistence map 909, edge detection and extraction of composite jitter distribution are performed in step 942 to generate a 1 dimensional histogram for RJ, BUj decomposition 945. Using the 1 dimensional histogram for RJ, BUj decomposition 945 and the dimensional histogram for Rj, BUj decomposition 930, Q-Scale analysis 948 is performed to generate: help cursors and text for Q-Scale 951; Rj and BUj 954; a Rj and BUj histogram 957; and, a convolved CDF on log 10 scale 960. The convolved CDF on log 10 scale 960 is used to generate a bathtub curve 963. Also, in step 966, the convolved CDF on log 10 scale 960 is used to determine Tj from the CDF, which yields Tj 969.

After the step 936 is performed, a parameter sum is performed, in step 972, using the Rj and BUj 954 to determine DDj+BUj 975. In step 978, the oscilloscope displays graphics parametrics and annotation using: the help cursors and text for Q-Scale 951; the Rj and BUj 954; the bathtub curve 963; the Rj and BUj histogram 957; the Tj 969; the DDj histogram 933; the DDj 939; the DDj+BUj 975; and, the Synch N-Cycle 924.

In an illustrative example of the method 900, the 906 branch may include analyzing, for example, up to about 31 unit intervals in the sequence. In such an example, substantially all of the information (e.g., including vertical noise information) may be recorded and/or stored. The 912 branch may treat all of the data sequence, although it may do so in a relatively memory efficient manner (e.g., while "losing" the vertical and horizontal noise components). Both methods may advantageously be useful for identifying systematic effects in the timing associated with ISI. Examples of various steps of the method 900 are described in further detail with reference to FIGS. 10A-10C.

Figure 10A:
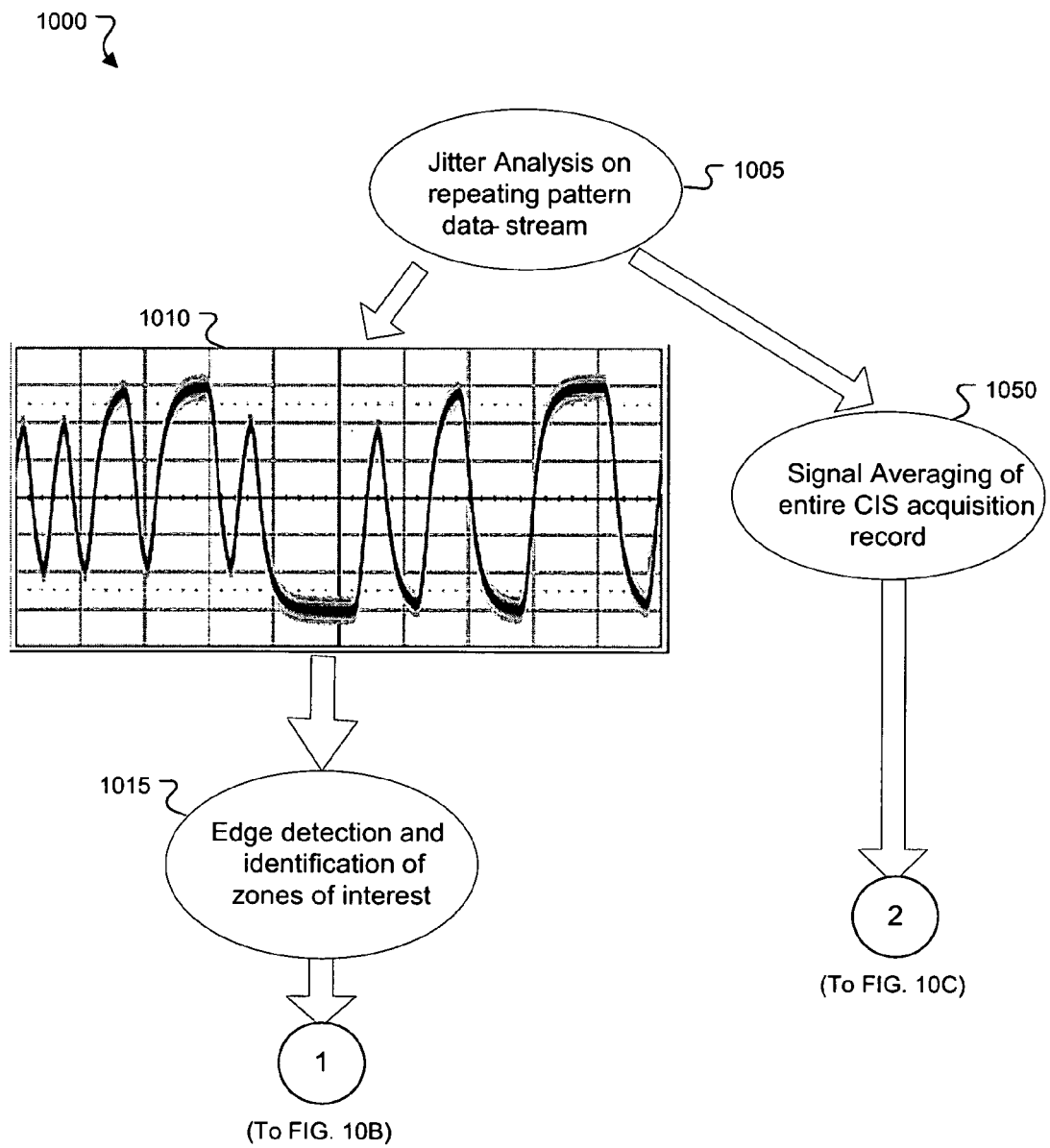
Figure 10B:
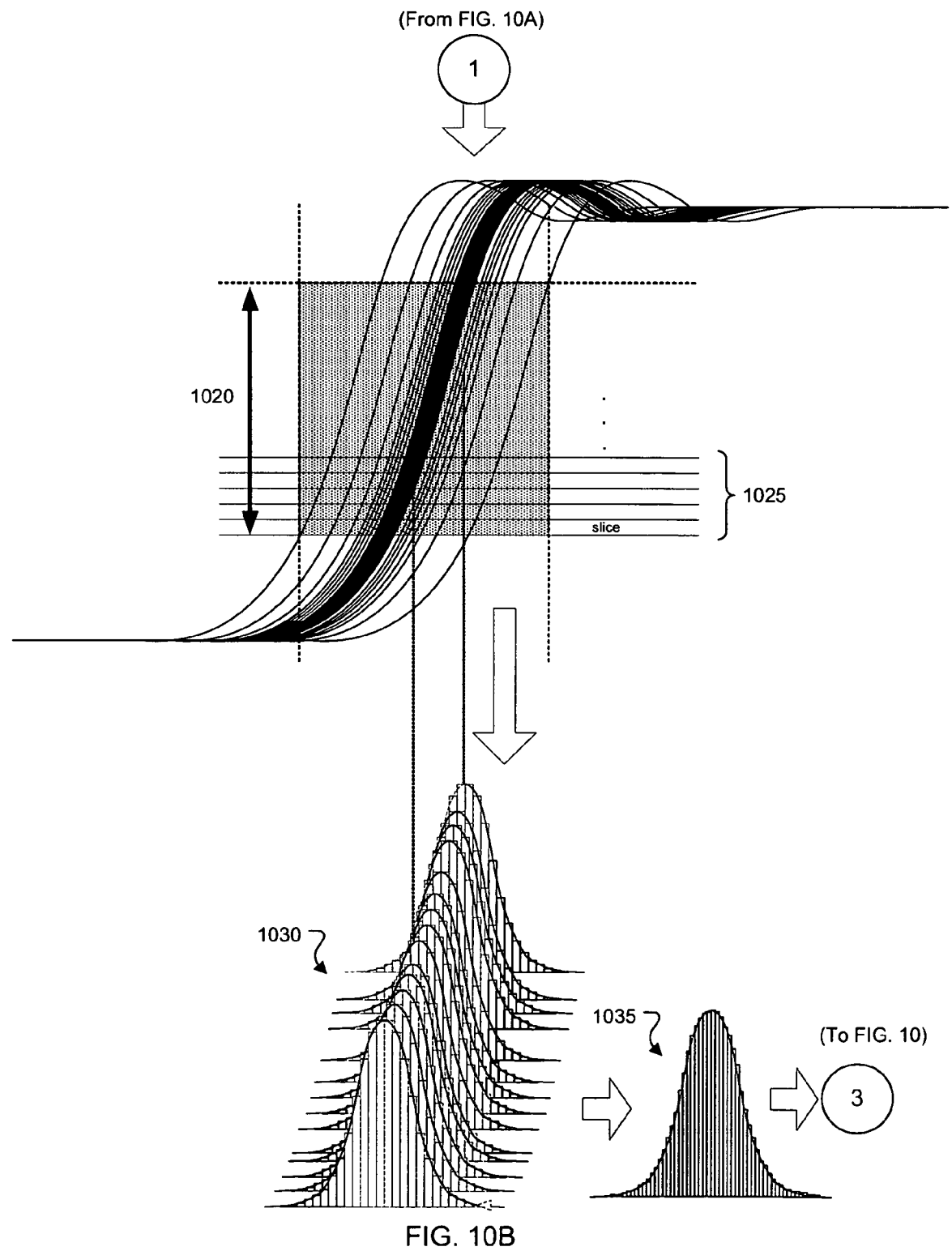
Figure 10C:
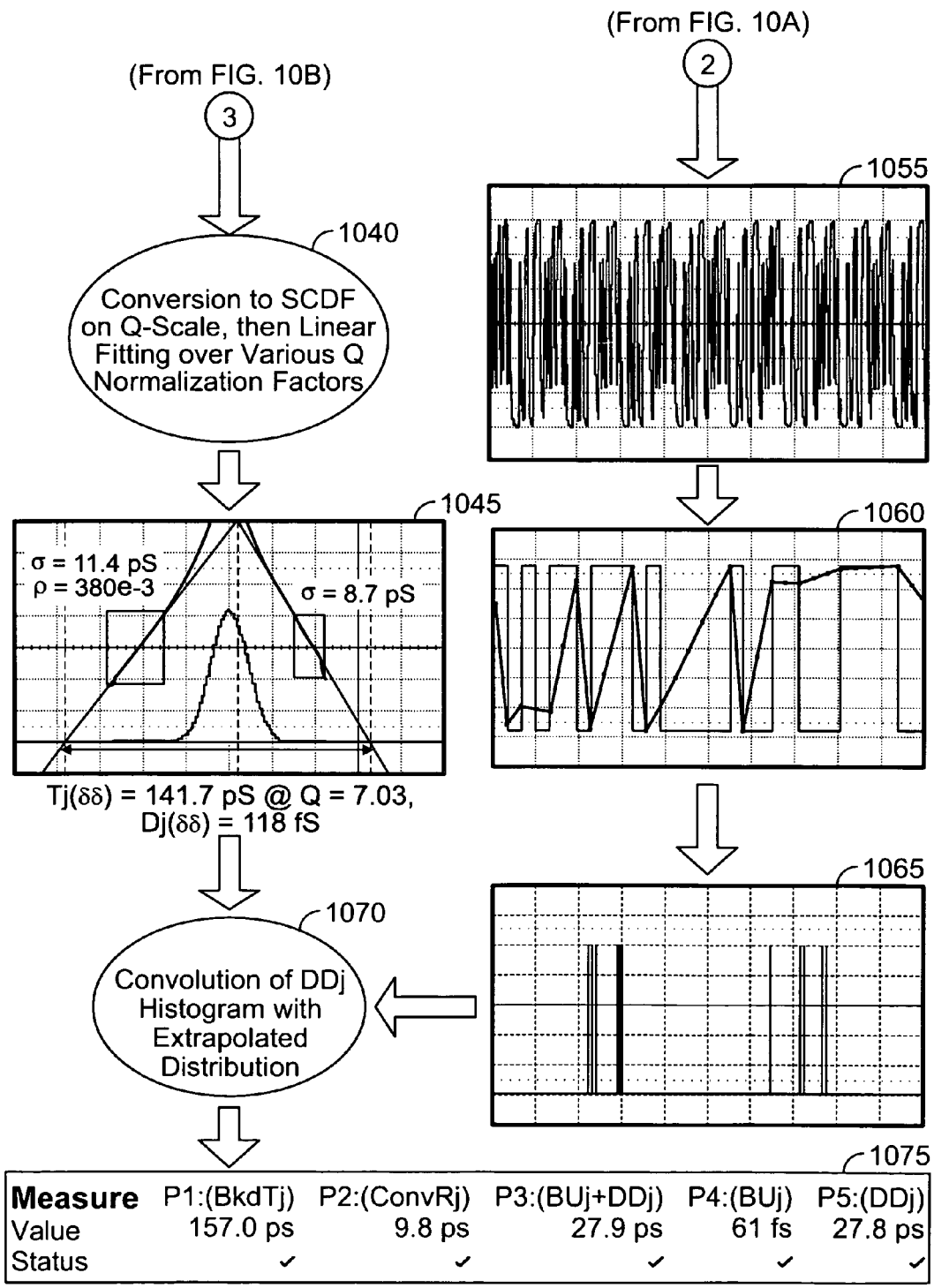

FIGS. 10A-10C show pictographs that illustrate steps of an exemplary procedure 1000 for evaluating jitter in a sampled waveform with a repeating pattern. As shown in FIG. 10A, the procedure 1000 includes performing jitter analysis on a repeating pattern data stream in step 1005. For example, the step 1005 may be initiated in response to a user input command to analyze an input signal.

After the step 1005, the data stream is accumulated into a persistence map 1010, which may very large in some examples. In an illustrative embodiment, the persistence map may include, for example, a 2D database with up to at least 1000 vertical by 65 k columns, and may involve up to at least 31 UI., for example.

Next, the procedure 1000 includes performing an edge detection and identification of zones of interest in step 1015.

For each detected edge, a fit zone 1020 is identified as shown in FIG. 10B. In the depicted example, the fit zone 1020 is divided into slices 1025. As shown, histograms 1030 are generated for each of the slices 1025. In some examples, each of the histograms 1030 may be generated for each of the horizontal slices 1025 using data from the persistence map 1010. In some examples, the mean of each of the histograms 1030 may be fitted to a function x=f(y) that may be a $1^{st}$ order or a $3^{rd}$ order polynomial. In some implementations, the histograms 1030 may be combined using their fitted x coordinate offset. In this example, the leftmost histogram 1030 corresponds to the lowest slice 1025. In some implementations, the combined histograms may coincide on a same scale.

The histograms 1030 are combined at a finer bin resolution (e.g., 4×), and then recombined to form a nominal number of bins per sigma. In an illustrative example, some histograms that may have different mean offsets are treated numerically to achieve a "summed" histogram that is substantially faithful to mean offsets that generally may have a fractional part in the offset when expressed in bins (or bin indices). In such examples, "upsampling" to a larger number of bins may advantageously retain more detail in the horizontal of the final summed histogram, thus affording greater precision in the final histogram. To reduce certain errors that may be associated with the binning process, a finer bin resolution may be employed. In this example, such error is reduced by a factor of 4. Next, a histogram 1035 for Q-Scale analysis is generated. For example, the histogram 1035 may represent the jitter distribution for edges obtained from the persistence map 1010.

As shown in FIG 10C, the histogram 1035 is converted, in step 1040, to SCDF on Q-Scale, and then a linear fitting process is attempted using various Q normalization factors. The procedure in step 1040 generates a Q-Scale graph 1045. Next, using the Q-Scale graph 1045, a Q-Scale analysis of the SCDF may be performed to obtain a normalization factor, Rj, and BUj. For example, the normalization factor that generates a substantially linear Q-Scale representation of the CDF may be selected.

In addition, to determine an extrapolated PDF, the procedure 1000 also includes performing a signal averaging of an entire CIS acquisition record in step 1050 after the step 1005 (FIG. 10A). Next, as shown in FIG. 10C, an average of the acquisition data 1055 of, for example, up to about 10,000 sweeps or more, is generated. Then, an edge displacement 1060 may be determined as a function of a position of each bit in the received pattern. Next, for each edge displacement value, an edge displacement histogram 1065 is identified.

Next, the extrapolated distribution from the Q-Scale analysis of the SCDF 1045 is convolved with the DDj histogram of the histogram 1065 at step 1070. This convolution may yield estimated jitter in the data stream. For example, some estimates (e.g., BkdTj, Conv Rj, BUj+DDj, BUj, and DDj) representing a jitter are presented in a result display 1075. In this example, BkdTj may generally represent total jitter (Tj). In an illustrative embodiment, overall CDF can be estimated from separating Rj from Dj, and identifying or estimating the strengths and means of the distributions dominating the two extremes. This may yield an estimate for Tj, which may advantageously be used, for example, to predict bit error rates (or bit error ratios) for serial data streams.

In some implementations, methods may be performed to measure jitter in data-stream containing non-repeating pattern.

For example, the oscilloscope may measure jitter of input signals that include a non-return to zero (NRZ) data stream of nearly constant rate, with a synchronous signal (clock) applied to the trigger or prescaler input of the oscilloscope. Jitter measurements in the oscilloscope can either be configured manually before enabling the jitter measurement, or set semi-automatically using the "Check Scope Setup" button. In one example, the oscilloscope may be configured in CIS acquisition mode. Settings for CIS acquisition may include PLL Bandwidth "High" and Samples per UI=1024 or 2048. A time base may be set to a minimum (e.g., based on 10 divisions), which may allow for more than 2 repetitions of the repeating pattern. If the total number of points acquired in order to meet the above requirement is less than 1M points, then the time base setting may be increased to have around 1M to improve efficiency.

In some examples, the oscilloscope may measure an overall jitter of input signals that do not have timing errors associated with particular positions in a sequence of a pattern, such as when no repeating pattern is identified. According to some embodiments, the analysis may work directly from the eye diagram (where all bits are treated equally). The shape of the eye diagram may be used to determine the Tj, Rj and Dj. As used in this example, "shape" of the eye diagram may generally refer to the detail of the persistence database associated with the eye-diagram.

Even though the pattern need not be repeating, the UI's or unit intervals are repeating and cycling through whatever states the signal stream is passing. As such, the CIS acquisition data can be used directly to populate a persistence map representing exactly one unit interval. The horizontal coordinate of every sample in the CIS record is used (modulo τ where τ is the duration of the bit interval, or the period of the bit clock) to populate a "smallish" 2D persistence map or 2D database. This modulo procedure may be done without any assumptions concerning the detailed (sub 1 UI) phase of the signal, which is fixed but unknown.

The accumulated eye (as described in the previous step) is then analyzed for periodicity in total population in the central (vertical) zone. An exemplary procedure uses the central 20% of the vertically populated region for the overall eye diagram. Fourier Analysis (e.g., FFT) may be used to analyze the density function vs. horizontal column position to ascertain the phase of the maximum magnitude element. This magnitude element may occur, for example, in the first horizontal bin corresponding to 1/duration of a unit interval. Some examples may accommodate an efficient complex FFT by selecting the number of columns to be a power of 2 (e.g., 1024 columns). This phase and knowledge of how many UI's are assumed to be in the persistence map (always 1 UI in this case) are used to learn the rotation in the columns needed to center either the crossing point of the eye or the opening of the eye.

In some embodiments, the analysis may determine the correct amount to rotate the persistence map, so that the crossing region is precisely centered in the horizontal coordinate.

In some embodiments, a waveform processing system may use a vertical "height" (e.g., which may be specified via a dialog in an interactive windowed graphical user interface) to take a slice of persistence data to form a 1-D histogram of overall jitter. Using a procedure similar to that described above with respect to repeating patterns, the histogram may be transformed into a CDF and/or an SCDF. In some embodiments, the vertical coordinates of the SCDF for each horizontal coordinate may be translated to the Q-Scale. As the distributions (e.g., the CDF and/or the SCDF) are analyzed, Rj and Dj results, for example, may be directly determined from embodiments that include performing a Q-Scale analysis.

Jitter may be decomposed using Rj and Dj results directly from the Q-scale analysis. The measured transition density and a specified BER may be used to calculate the Tj values (at the specified BER level) from the SCDF output of the Q-Scale Analysis.

Figure 11:
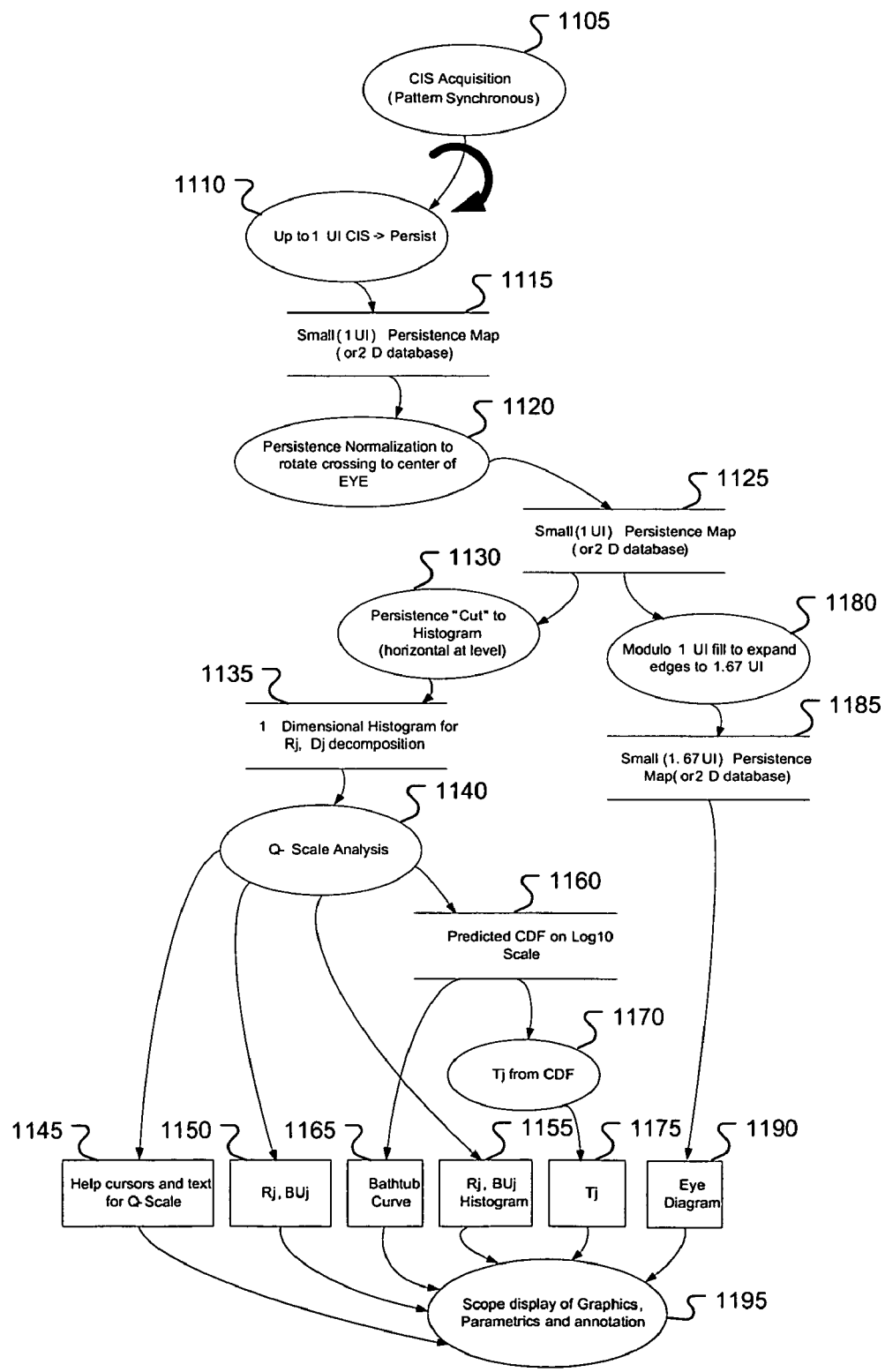
FIGS. 11-12 illustrate an exemplary analysis of signals with non-repeating patterns.

FIG. 11 is a data flow diagram showing an exemplary method 1100 for performing non-repeating pattern jitter analysis. An oscilloscope may use some or all operations in the method 1100 to measure jitter in the input signals. The method 1100 begins when the oscilloscope perform CIS acquisition for a number of sweeps to collect data from the input signals in step 1105. For example, the oscilloscope may perform CIS acquisition for up to about 10 k sweeps or more.

Next, in step 1110, up to 1 UI from the CIS data is stored to generate a small persistence map 1115, or optionally a 2D database. In step 1120, the persistence is normalized to rotate a crossing to a center of the EYE. The step 1120 generates a small persistence map 1125. In this example, the 1 UI persistence map has been "rotated" to correctly center the "mean" crossing phase. This may, in some cases, substantially reduce or remove very low rate drift in either the signal or the instrument. In addition, possible "binning artifacts" that can distort the populations in the 2D eye diagram may be addressed during this step to obtain a better statistical representation of the observed "eye." Using the small persistence map 1125, the oscilloscope performs a persistence cut to histogram (e.g., horizontal at level) in step 1130 to generate a one dimensional histogram for RJ, DJ decomposition 1135.

From the 1 dimensional histogram for RJ, DJ decomposition 1135, a Q-Scale analysis is performed in step 1140 to generate: help cursors and text for Q-Scale 1145; Rj and BUj 1150; a Rj and BUj histogram 1155; and, a predicted CDF on Log 10 scale 1160. The predicted CDF on Log 10 scale 1160 is used to generate a bathtub curve 1165. In step 1170, the oscilloscope uses the predicted CDF on Log 10 scale 1160 to determine Tj from CDF to generate Tj 1175.

In this example, using the small persistence map 1125, the oscilloscope modulo 1 UI may fill to expand edges to 1.67 UI in step 1180 to generate a small persistence map 1185 with 1.67 UI. The small persistence map 1185 is used to generate an eye diagram 1190.

In step 1195, the oscilloscope displays graphics parametrics and annotation using: the help cursors and text for Q-Scale 1145; the RJ and BUj 1150; the bathtub curve 1165; the RU and BUj histogram 1155; the Tj 1175; and, the Eye diagram 1190.

Figure 12:
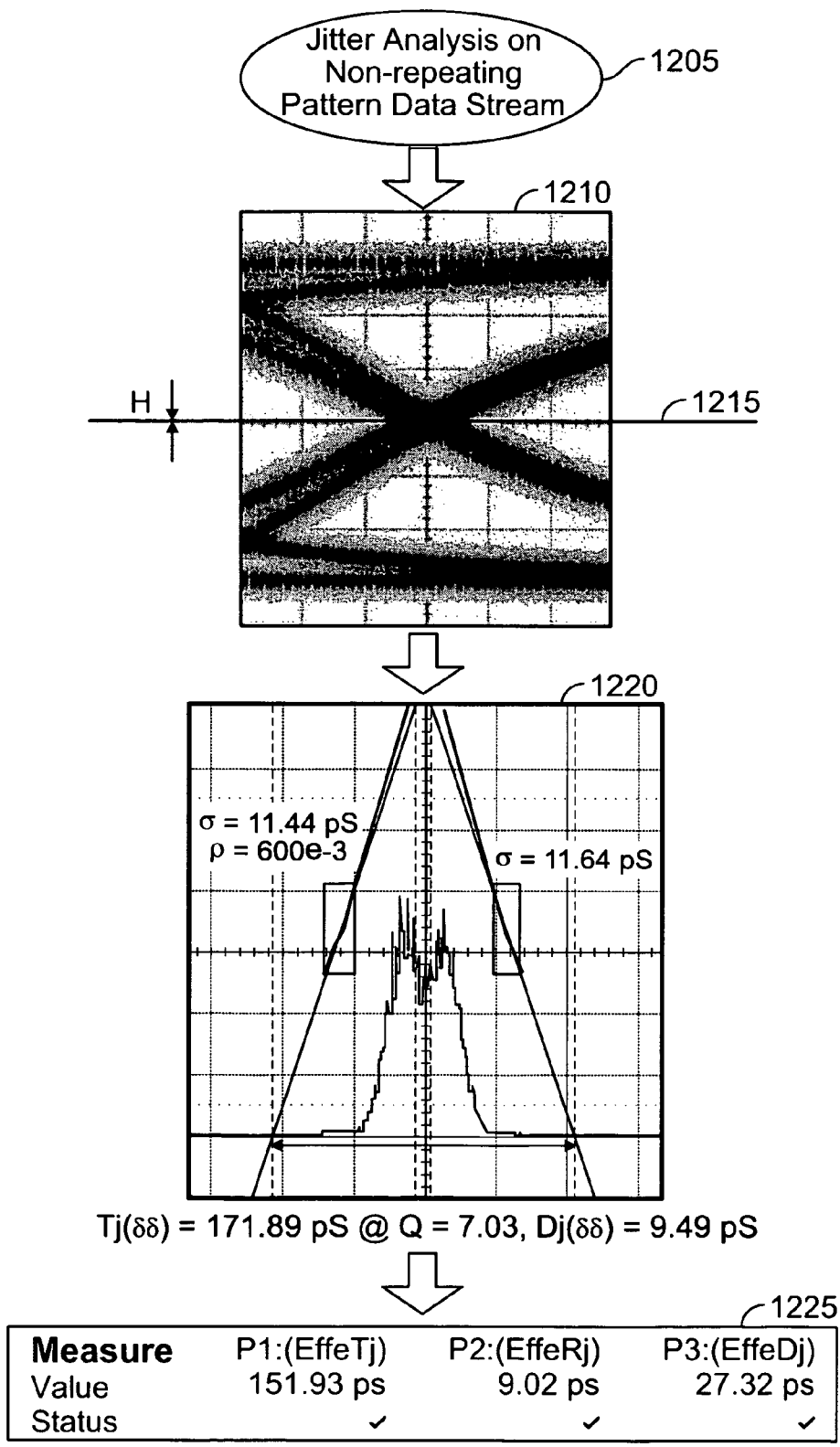

FIG. 12 show pictographs that illustrate steps of an exemplary procedure 1200 for evaluating jitter in a sampled waveform with a non-repeating pattern. The procedure 1200 includes performing a jitter analysis on non-repeating pattern data stream 1205. Next, a persistence map 1210 is generated. A thin slice 1215 with a cut height (H) is shown. Using data from the slice 1215, a Q-scale plot 1220 is generated by, for example first transforming into a CDF and a SCDF. This Q-scale plot 1220 in this example yields estimated measurements 1225 of jitter in the data stream. For example, the measurements 1225 include effective values of Tj, Rj, and Dj.

Figure 13:
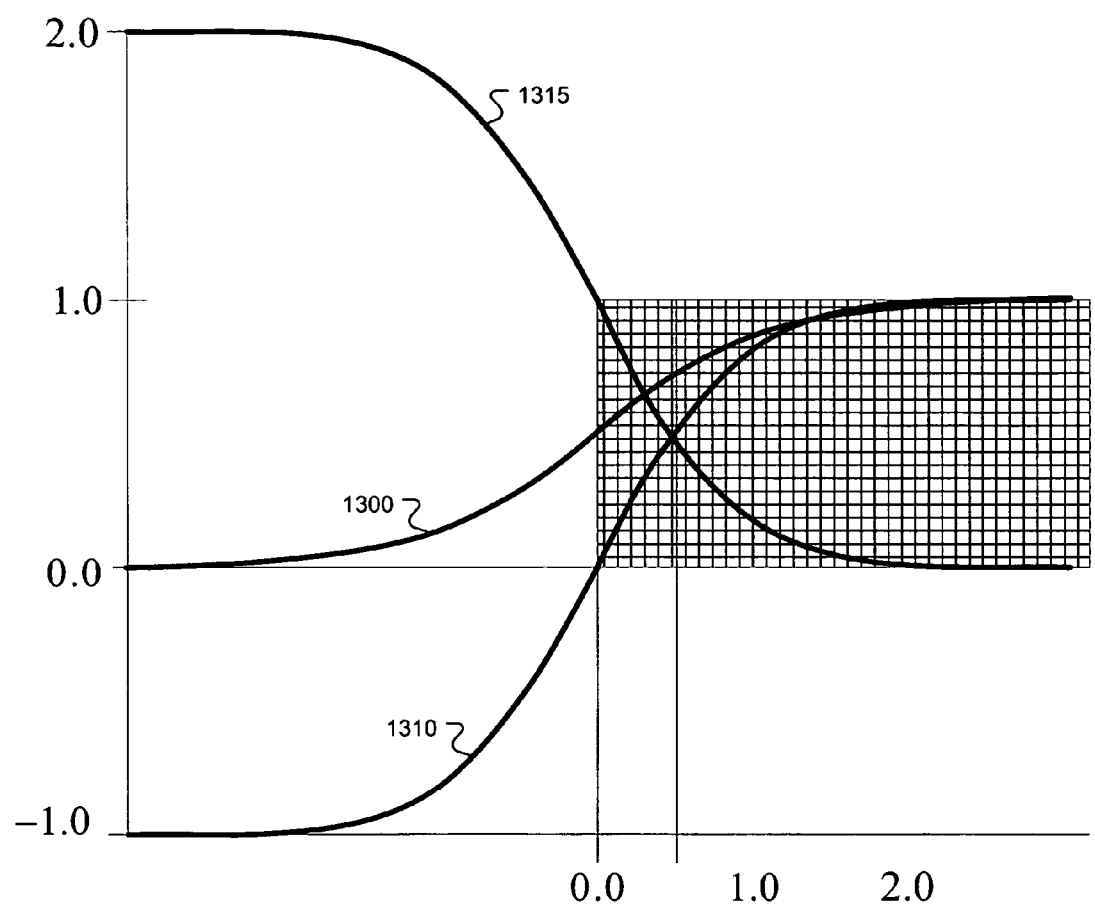
FIG. 13 is a graph illustrating exemplary functions.

As indicated in FIG. 13, a CDF 1300 for a normal Gaussian is related to an error function 1310 as follows.

$$CDF(x) = \frac{1 - \text{erf}(x)}{2} \quad (14)$$

The CDF 1300 being the function which provides the probability for an event (for a system obeying a Gaussian probability density function) occurring to the left of the value x.

Note also, by inspection:

$$CDF^{-1}(p) = \text{erf}^{-1}(2p-1) \quad (15)$$

where the (−1) exponent denotes "inverse" operator. An inverse CDF is the function that gives a displacement (in sigmas) from the mean, for which the probability to the left of said displacement is the input variable, p.

A complementary error function is not the inverse error function, $\text{erf}^{-1}(p)$. If p is the evaluation of the error function for a displacement x, then the inverse error function of x will evaluate to p.

The heuristic jitter equation is linearly related to this inverse error function.

$$Tj(\text{BER}) = Dj + \alpha(\text{BER}) \cdot Rj \quad (16)$$

where the function $\alpha(\text{BER})$ is the number of standard deviations for a Gaussian with sigma of 1, which corresponds to the specified bit error rate (BER). In various implementations, $\alpha(\text{BER})$ may be within a constant factor, exactly the inverse error function, $\text{erf}^{-1}(1-\text{BER})$. That is:

$$\alpha(BER) = 2 \cdot \left| CDF_{Gaussian}^{-1}\left(\frac{BER}{2\rho_{tx}}\right) \right| \quad (17)$$

or $$\alpha(BER) = 2 \cdot \left| \text{erf}^{-1}\left(\frac{BER}{\rho_{tx}} - 1\right) \right| \quad (18)$$

In both cases, various embodiments may incorporate the transition density. The alpha factor may be used to calculate Tj.

In various embodiments, the Q-Scale may be used to view a cumulative probability function. A Gaussian distributed histogram which has been transformed into a SCDF and plotted on a Q-Scale appears as a triangular function, with the apex of the triangle converging at Q=0 at a point, and with equal slopes on each side, the reciprocal of the slope being the sigma of the Gaussian distribution. That may provide an insightful representation, in part because the human eye discriminates between "linear vs. non-linear" data sets. Furthermore, linear relationships may be easier to intuitively extrapolate and/or interpolate.

The Q-Scale may be useful for analyzing vertical noise distributions, which may be governed by similar physical mechanisms. For example, Q-scale may provide a useful tool for BER prediction for some optical signals in which vertical noise sometimes dominates horizontal noise. In other examples, various embodiments could be applied to the analysis of various types of statistical distributions, including simple and/or complex (compound) distributions, or to analysis directed to determining confidence intervals for various confidence levels. Accordingly, various embodiments may be used to provide a tool for general application to statistical analysis. For example, some embodiments may be used to analyze data obtained from polls, or statistics acquired on levels of chemicals in water samples. Some embodiments may be advantageously applied where an EDF is interpreted or analyzed for purposes of predicting worst case or rare occurrences.

Jitter measurements may display the SCDF on a $\log_{10}$ (BER) scale using a bathtub curve, which may be used to convey the nature of the SCDF on a logarithmic scale to represent the confidence interval for an observed distribution as a function of the $\log_{10}$ of BER, where the confidence level is $C_L = 1.0 - \text{BER}$. For example, a width of the SCDF at any BER may represent the confidence interval for that BER. In some examples, the breadth of the SCDF may give Tj for a selected BER.

Various embodiments may be adapted to identify distributions that do not satisfy a threshold condition for characterization as being substantially Gaussian. When determining whether an obtained distribution, such as the SCDF, is substantially Gaussian, additional procedures may be used. For example, a normalized Q-Scale SCDF may be constructed such that a user may intuitively (e.g., by viewing the graphical output of the normalized Q-Scale SCDF) determine the degree of Gaussian character of an obtained distribution. In some examples, a method for generating the normalized Q-Scale SCDF may generate an output signal (e.g., an identification or error message) to indicate that the analyzed distribution is not Gaussian.

In accordance with the some embodiments, a system may first calculate the measured SCDF, and then plot the cumulative probabilities on a Q-Scale to reveal Gaussian distributions to be straight lines.

Figure 14A:
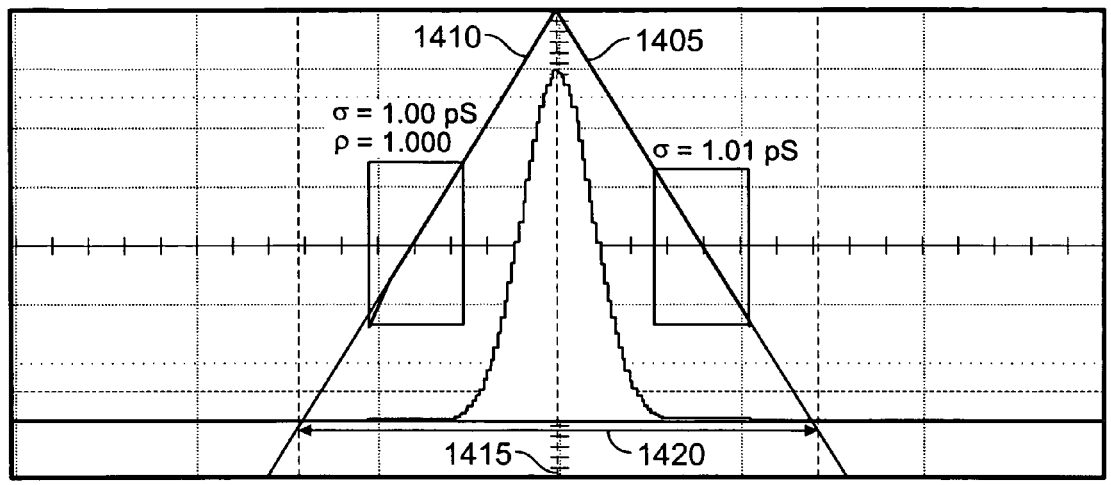
FIGS. 14-17 illustrate effects of normalization factors on exemplary Q-scale plots.

FIG. 14A shows an example plot 1400 that represents a single normal (modeled Gaussian with 1 ps sigma) SCDF shown on Q-Scale. The total area of the PDF is 1.0. The plot 1400 includes a right-hand-side 1405 and a left-hand-side 1410 of the Q-Scale. Using the plot 1400, a mean, a sigma, and a Tj of the jitter may be determined. For example, the mean may be determined at the horizontal coordinate of a point 1415 where the right-hand-side 1405 and the left-hand-side 1410 intersect the Q=0 line. Sigmas of the distribution may be determined by the slope of the Q-Scale. Using a width 1420 of the Q-Scale plot 1400, Tj and Dj can be determined.

Figure 14B:
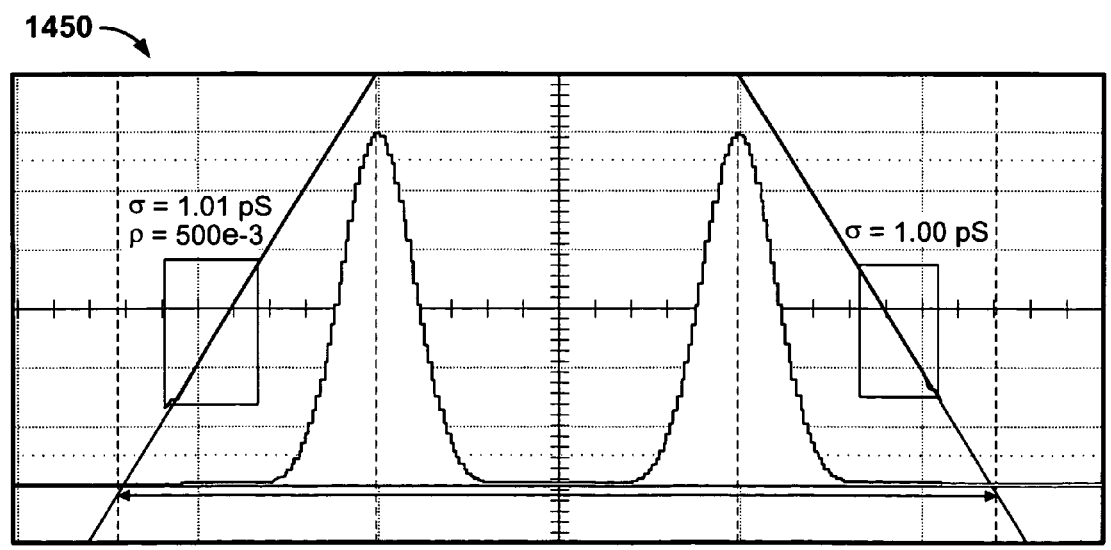

FIG. 14B shows an example plot 1450 representing a Dual-Dirac normal distribution. The total area of the Dual-Dirac normal distributions PDF is also 1.0. In this example, the curved actual Q-Scale SCDF may not quite behaving linearly near Q=0 (top of screen) without properly select a normalization. In the depicted example, a normalization factor of around 2 generates a Q-Scale curve that the distribution appears to start behaving like a Gaussian.

Q-Scale normalization may be applied in some embodiments to allow for an additional factor for our Q-scale analysis. Some embodiments permit a normalization factor such that Q represents a probability (as did BER), but with an additional implicit linear factor. For what is referred to herein as a Q-Scale normalization of 0.5, a Gaussian with area (or total probability of 0.5) behaves linearly on the Q-Scale. Since the most simplified Dual-Dirac model for jitter consists of two area =½ Gaussians separated by some Dj (Dj=$\mu_R$-$\mu_L$). Each Gaussian may be assumed to have the same characteristic sigma or Rj (where Rj=$\sigma_L$=$\sigma_R$=$\sigma$). Plotted with a Q-Scale normalization of ½, each of the Gaussians may have an equivalent area of 1.0, and so behave linearly.

Figure 15A:
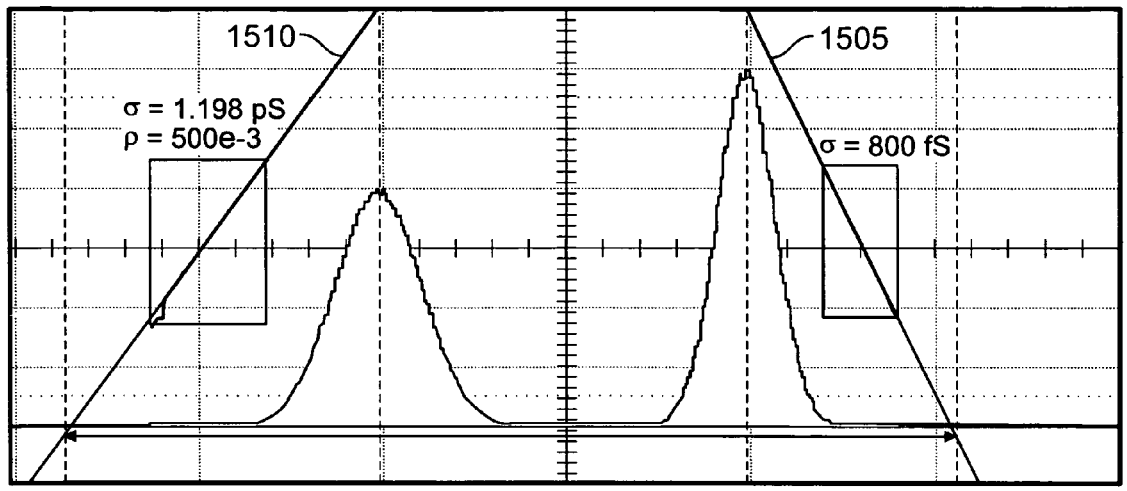

In some examples, the Q-Scale normalization may cause the Gaussian of area equal to the normalization factor to behave linearly. This it does independently of the sigma. FIG. 15A shows an example plot 1500 of a Dual-Dirac distribution (modeled/simulated distribution with equal amplitude) with a Q-scale normalization of ρ=0.50. In the depicted example, the left-side Gaussian has a modeled sigma of 1.2 ps, whereas the right hand distribution, only 0.80 ps. The plot 1500 exhibits linear behaviors for both right distribution extreme 1505 and left distribution extreme 1510. Using the plot 1500, a user may obtain substantially accurate values for the means and the sigmas of the displayed distribution.

Figure 15B:
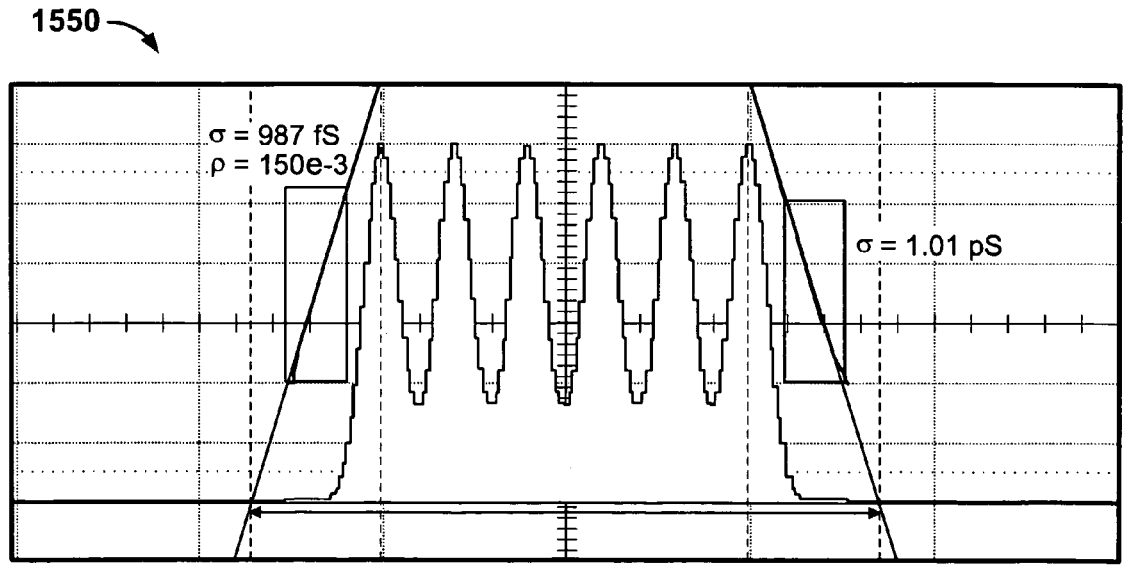

FIG. 15B shows an exemplary plot 1550 of a (6×) Hexa-Dirac distribution. The plot 1550 includes a Q-Scale normalization of about ⅙. As shown, the Q-Scale normalization exhibits very linear behavior on both sides. It also yields substantially correct sigma and Dj(δδ).

Figure 16A:
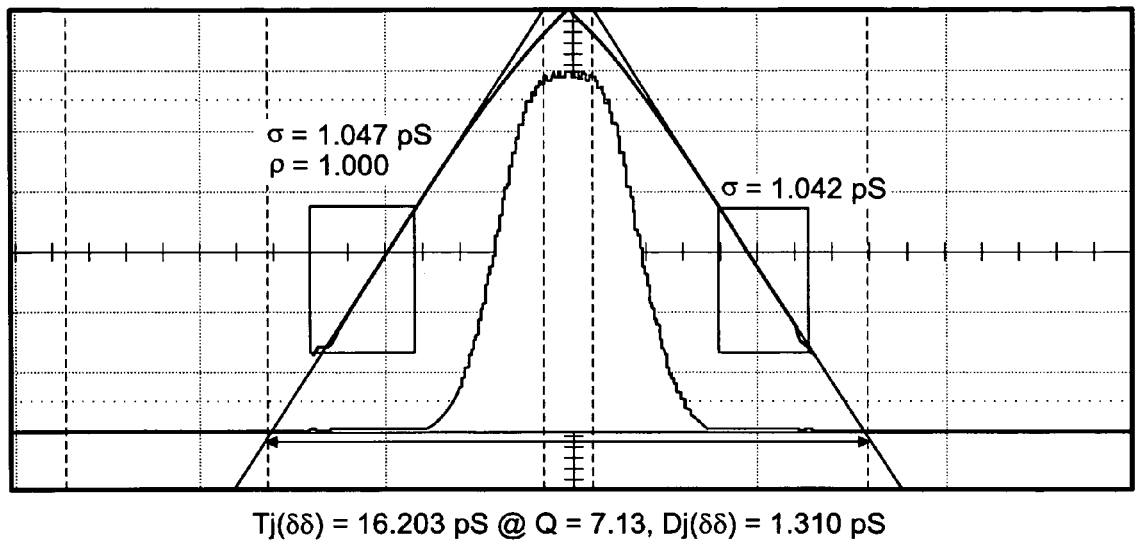

As illustrated in an exemplary plot 1600 in FIG. 16A, in which $\sigma_L$=$\sigma_R$=1.0 ps, Dj=2 ps, a Q-Scale normalization factor is set to one. The plot 1600 does not appear to show a Dual-Dirac. While the Q-Scale normalization is set to 1.0, the reported result is Dj(δδ)=1.31 ps instead of 2 ps.

Figure 16B:
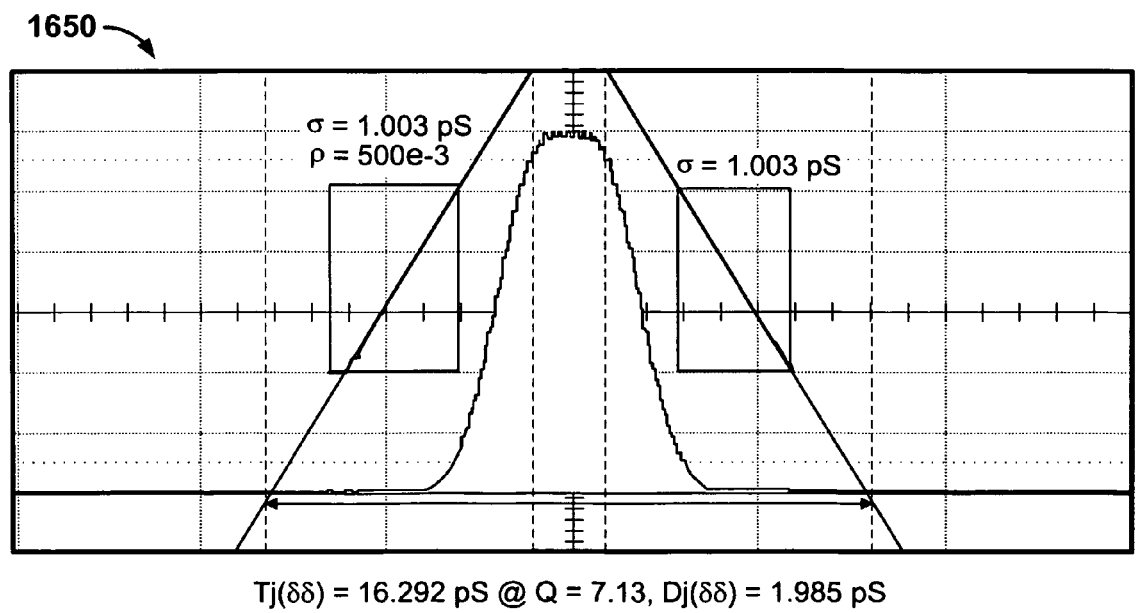

However, when the Q-Scale normalization is adjusted to show linear behavior of the extremes, it is evident that the amplitude of the Gaussians contributing to the tails is ½. In FIG. 16B, the Q-Scale normalization factor is set to 0.5. With the Q-Scale normalization set to 0.5, the reported Dj(δδ) and the reported sigmas are substantially correct. For example, the reported Dj and sigmas match the modeled variables for sigma and the separation between the delta-functions.

The usual equation for Q as a function of BER is:

$$Q(BER) = CDF^{-1}\left(\frac{BER}{2}\right) \quad (19)$$

If instead, the Q-Scale normalization is incorporated, it's as though the probabilities by the reciprocal of the factor $\rho_{norm}$ have been increased as follows:

$$Q(BER) = CDF^{-1}\left(\frac{BER}{2\rho_{norm}}\right) \quad (20)$$

In another example, the Q-Scale normalization may correctly identify the Dj(δδ) and underlying σ contributing to the observed distribution for a PDF of a sinusoidal function.

Figure 17A:
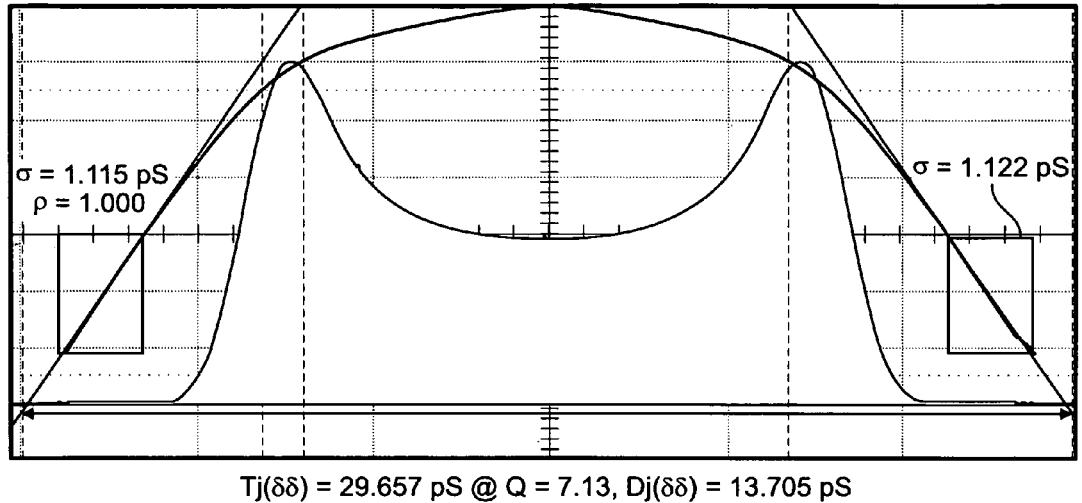

FIG. 17A shows an exemplary un-normalized Q-Scale plot 1700 for the PDF of a sinusoid with peak-to-peak amplitude 16 ps convolved (Monte-Carlo) with a 1 ps Gaussian. The plot 1700 shows non-linear extremal behavior although asymptotically linear (large Q).

Figure 17B:
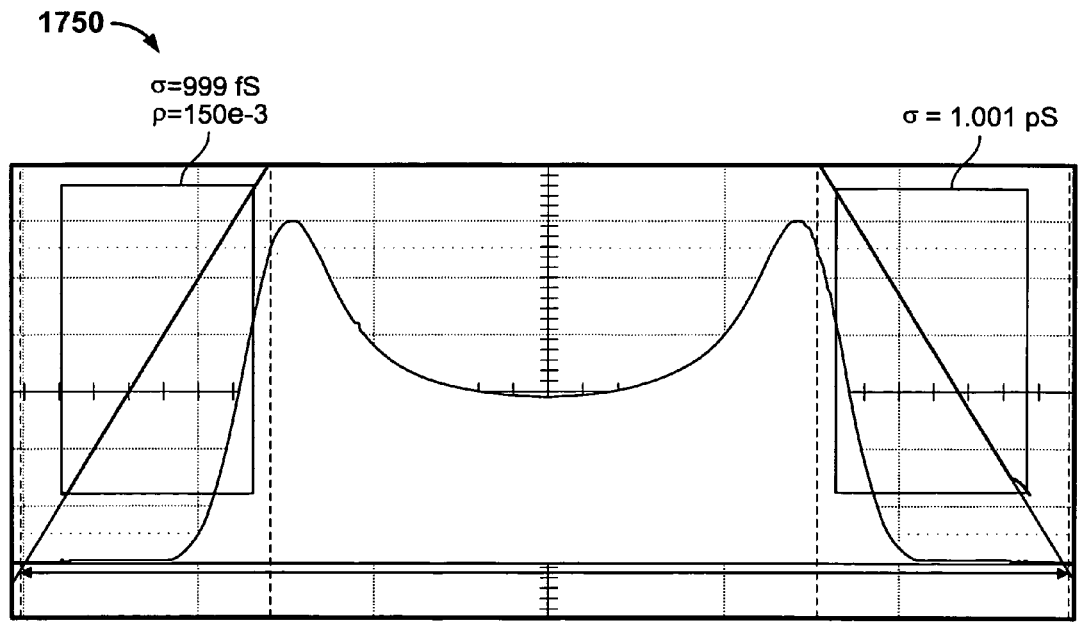

Using automatic Q-Scale normalization, as shown in the exemplary plot 1750 in FIG. 17B, the substantially correct details of the underlying probabilities are evident. The displayed Dj(σσ)=15.560 ps indicates a small error (440 fs), which might be attributed, at least in part, to factors (e.g., the Monte Carlo analysis) other than the Q-Scale analysis.

Upon completion of a Q-scale algorithm, a result may be stored in a memory, buffer, register, or other data store. The stored result may include one or more parameters that include, but are not limited to, at least one mean, sigma, amplitude, normalization factor, degree of linearity of the Q-scale, indication whether a distribution is Gaussian or not (e.g., based on a threshold), specified bit error rate, or combinations of these and/or other data. Such stored information may be displayed, transmitted, sent for permanent storage, communicated to another device, and/or post-processed. In some examples, results data may be displayed in graphical form for observation by a user.

In some embodiments, a user may manipulate a normalization factor. For example, a user may adjust a control knob, slide, or enter input using key pad, pointing device, touch screen, arrow keys, or other input mechanism to increase or decrease a value normalization factor within a range. In some applications, a user may view a Q-scale plot for a specified BER and user-selected normalization factor. The user may manually adjust the normalization factor until the Q-scale plot appears substantially linear based on visual inspection of the display. In some embodiments, the display may include information that indicates the values of the mean(s), amplitudes(s), and/or sigma(s) of the Q-scale.

In some implementations, a processor may execute instructions to automate the search for a normalization factor that scales a BER so that, when a Q-scale is evaluated as a function of the scaled BER, the evaluated Q-scale is nearly or substantially linear. In some embodiments, the processor may further execute instructions to evaluate a linearity of the evaluated Q-scale at each normalization factor. If no normalization factor values within a range can be found for which the evaluated Q-scale meets a predetermined linearity threshold or other linearity criterion, then the processor may cause a signal to be generated to indicate, for example, that the distribution under analysis is not sufficiently Gaussian.

In various embodiments, the inverse CDF for a Gaussian distribution may be calculated using routines in commercially available software packages, such as MathCad (available from Parametric Technology Corp., Massachusetts), Mathematica (available from Wolfram Research, Inc.), and MATLAB (available from The Math Works, Inc., Massachusetts).

In some examples, a direct calculation may be carried out in some programming languages, such as C or C++, that can be programmed to calculate numerical approximations. Optionally, it may also be calculated by performing the numerical integration of the normalized Gaussian (in the case of the $CDF_G^{-1}$ (p)). The (forward) error function and the $CDF_G$ (x) are readily available in some commercially available math packages and libraries. Direct calculation using C++ may be based on an algorithm available online from one or more sources, such as at home.online.no/~pjacklam/notes/invnorm/#The$_{13}$ distribution$_{13}$ function.

CDF refers to a Cumulative Distribution Function (for any distribution) which in the preferred embodiment is:

$$CDF(x) = \int_{-\infty}^{x} PDF(u)du \qquad (21)$$

CDF of Gaussian refers to a Cumulative Distribution for a Gaussian Distribution (i.e. where the PDF(x) is a Gaussian function), which in the preferred embodiment is:

$$CDF_{Gaussian}(x) = \frac{1 - \text{erf}(x)}{2} \qquad (22)$$

The Probability Distribution Function, sometimes written ρ(x), for a Gaussian behaved phenomenon is in the preferred embodiment:

$$PDF_{Gaussian}(x) = \rho_{Gaussian}(x) = \frac{w}{\sigma\sqrt{2\pi}} e^{-\frac{(x-\mu)^2}{2\sigma^2}} \qquad (23)$$

where μ is the distribution's mean, σ is the characteristic sigma, and w is the overall probability. When w=1, the distribution is said to be normal.

SCDF refers to a Symmetric Cumulative Distribution Function, which grows monotonically from 0 to 0.5 and rather than growing larger than 0.5, diminishes monotonically back down to zero.

Inverse CDF may refer to $CDF^{-1}$(p), which gives the coordinate x, for which the probability governed by a Gaussian distribution of an event occurring to the left of that coordinate is p.

Q-scale may refer to an alternative vertical scale to BER or Log 10(BER), where:

$$Q(\text{BER}) = CDF_{Gaussian}^{-1}(\text{BER}/2) \qquad (24)$$

or alternatively for a "normalized Q-Scale"

$$Q(\text{BER}) = CDF_{Gaussian}^{-1}(\text{BER}/(\rho_{norm} \cdot 2)) \qquad (25)$$

An exemplary histogram may refer to a series of populations associated with (usually) adjacent horizontal intervals of equal size, and may also be referred to as a frequency of occurrence graph. A histogram is typically formed from a series of measurements or observations, by "binning" those values (of the measurement or observation) into bins or intervals of the histogram.

An observed or measured distribution may include a histogram with some number of bins, some bin width or interval, and a coordinate associated (usually with the left edge) of the first or leftmost bin.

An Error Function, or erf( ), is the "Error Function" is, in the preferred embodiment, defined as:

$$\text{erf}(x) = \frac{2}{\sqrt{\pi}} \int_{-\infty}^{x} e^{-u^2} du \qquad (26)$$

In the preferred embodiment, the error function is a mathematical function closely related to the cumulative distribution function for a Gaussian, and is defined as:

$$1 - 2CDF_{Gaussian}(x) = \text{erf}(x) \qquad (27)$$

A Complementary Error Function is, in the preferred embodiment, defined as:

$$\text{erfc}(x) \equiv 1 - \text{erf}(x) \qquad (28)$$

or $$\text{erfc}(x) = \frac{2}{\sqrt{\pi}} \int_{x}^{\infty} e^{-u^2} du \qquad (29)$$

An inverse Error Function may refer to $\text{erf}^{1}(x)$, which is the inverse of the error function. Whereas the error function gives a value related to the probability of an event occurring to the left of x, for a given probability, p, the inverse error function gives (as a value related to) the probability of an event occurring to the left of a horizontal coordinate, when only the coordinate is specified.

Rj or RJ may refer to "Random jitter," which may include random Gaussian unbounded jitter, or the part of jitter that grows with decreasing BER Dj or DJ may refer to "Deterministic jitter," or bounded jitter. In the preferred embodiment, DJ includes, for example, periodic jitter and data dependant jitter.

Tj or TJ may refer to "Total jitter," where the word total may refer to an expected value of the observed peak-to-peak timing for a specified number of observations. In general, Tj may be qualified by a specified (or assumed transition density) and a Bit Error Rate (BER).

Transition Density may refer to $\rho_{tx}$ is the ratio of edges to UI's for a given data stream or sometimes for a given test data pattern. The transition density affects the calculation of Total jitter. An exemplary data stream may have a transition density of approximately 0.5.

A Prescaler is in the preferred embodiment an electronic circuit that synchronously divides down a clock by some factor N.

Data rates continue to increase in digital systems, communication systems, computer systems, and in other applications. In such applications, various devices may communicate by sending or receiving signals that are encoded with information in the form of signal levels (e.g., amplitude) in certain intervals of time. Proper decoding of periodic signals, for example, may involve measuring the signal level in the correct time interval, or period. As data rates increase, margins of error in the signal level timing tend to decrease.

In general, errors in which a signal deviates in its timing from an ideal timing is sometimes referred to as "jitter." For example, an increase in jitter for a signal encoded with a stream of digital data may cause an increase in a bit error rate (BER) for that data stream.

Jitter may be added to a signal from a variety of sources. For example, one source of jitter may be in circuit elements used that generate, transmit, convey, process, and/or receive the signal. To various degrees, circuit elements may add jitter to the signal through cross-talk, reflections, shot noise, flicker noise, and/or thermal noise. Electromagnetic interference (EMI) may also contribute to jitter.

Typically, jitter may be measured as a total jitter. Total jitter may represent a convolution of all independent jitter components, which can include contributions from deterministic and/or random components. Random jitter, such as that caused by noise, typically exhibits a Gaussian distribution. Deterministic jitter may include periodic jitter, duty cycle distortion, and/or intersymbol interference, for example.

Jitter measurements may be made in a variety of applications, examples of which may include Fibre Channel, Gigabit Ethernet, XAUI, InfiniBand, SONET, Serial ATA, 3GIO, and Firewire. To illustrate the importance of jitter in such applications, a nanosecond of jitter in a 100baseT (100 Mb/s) device may represent a 10% data uncertainty. For example, the same nanosecond of jitter may represent a 20% data uncertainty if the data rate is increased to 200 Mb/s, or a 100% data uncertainty in a Gigabit Ethernet device.

Suitable processors for the execution of a program of instructions include, by way of example, both general and special purpose microprocessors, which may include a single processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including, by way of example, semiconductor memory devices, such as EPROM, EEPROM, and flash memory devices; magnetic disks, such as internal hard disks and removable disks; magneto-optical disks; and, CD-ROM and DVD-ROM disks. The processor and the memory can be supplemented by, or incorporated in, ASICs (application-specific integrated circuits).

In some implementations, one or more user-interface features may be custom configured to perform specific functions. Various embodiments may be implemented in a computer system that includes a graphical user interface and/or an Internet browser. To provide for interaction with a user, some implementations may be implemented on a computer having a display device, such as a CRT (cathode ray tube) or LCD (liquid crystal display) monitor for displaying information to the user, a keyboard, and a pointing device, such as a mouse or a trackball by which the user can provide input to the computer.

In various embodiments, systems, such as the system 100, may communicate using suitable communication methods, equipment, and techniques. For example, the system 100 may communicate with a portable computer, network server, or other device using point-to-point communication in which a message is transported directly from the source to the receiver over a dedicated physical link (e.g., fiber optic link, point-to-point wiring, and daisy-chain). Other embodiments may transport messages by broadcasting to all or substantially all devices that are coupled together by a communication network, for example, by using omni-directional radio frequency (RF) signals, while still other embodiments may transport messages characterized by high directivity, such as RF signals transmitted using directional (i.e., narrow beam) antennas or infrared signals that may optionally be used with focusing optics. Still other embodiments are possible using appropriate interfaces and protocols such as, by way of example and not intended to be limiting, RS-232, RS-422, RS-485, 802.11 a/b/g, Wi-Fi, Ethernet, IrDA, FDDI (fiber distributed data interface), token-ring networks, or multiplexing techniques based on frequency, time, or code division. Some implementations may optionally incorporate features such as error checking and correction (ECC) for data integrity, or security measures, such as encryption (e.g., WEP) and password protection.

In some embodiments, each memory may be programmed with the same information and be initialized with substantially identical information stored in non-volatile memory. In other embodiments, one or more systems 100 may be custom configured to perform specific functions. For example, one system 100 may be calibrated for use to identify intrinsic jitter during production of other systems.

A number of embodiments have been described. Nevertheless, it will be understood that various modifications may be made. For example, advantageous results may be achieved if the steps of the disclosed techniques were performed in a different sequence, if components in the disclosed systems were combined in a different manner, or if the components were replaced or supplemented by other components. The functions and processes (including algorithms) may be performed in hardware, software, or a combination thereof. Accordingly, other embodiments are within the scope of the following claims.

What is claimed is:

1. A method for processing a waveform acquired by a test and measurement apparatus, the method comprising:
   acquiring samples of a signal for a plurality of periods of the signal by an acquisition module of the test and measurement apparatus;
   storing the acquired signals to a computer readable storage medium of the test and measurement apparatus;
   determining a distribution of transition times of the acquired signal by a processor of the test and measurement apparatus;
   applying a Q-scale algorithm by the processor of the test and measurement apparatus to evaluate the determined distribution at a bit error rate (BER), wherein the applying comprises:
   scaling the BER with at least one coefficient;
   evaluating the Q-scale as a function of the scaled BER;
   determining the at least one coefficient to provide a most linear fit of the evaluated Q-scale points;
   storing the at least one coefficient to a computer readable recording medium of the test and measurement apparatus; and
   determining a standard deviation of a distribution from a reciprocal of a slope of the Q-scale.

2. A method for processing a waveform acquired by a test and measurement apparatus, the method comprising:
   acquiring samples of a signal for a plurality of periods of the signal by an acquisition module of the test and measurement apparatus;
   storing the acquired signals to a computer readable storage medium of the test and measurement apparatus;
   determining a distribution of transition times of the acquired signal by a processor of the test and measurement apparatus;

applying a Q-scale algorithm by the processor of the test and measurement apparatus to evaluate the determined distribution at a bit error rate (BER), wherein the applying comprises:
scaling the BER with at least one coefficient;
evaluating the Q-scale as a function of the scaled BER;
determining the at least one coefficient to provide a most linear fit of the evaluated Q-scale points;
storing the at least one coefficient to a computer readable recording medium of the test and measurement apparatus; and
determining a mean of a distribution from an intercept of the Q-scale with the Q=0 axis.

3. A method for processing a waveform acquired by a test and measurement apparatus, the method comprising:
acquiring samples of a signal for a plurality of periods of the signal by an acquisition module of the test and measurement apparatus;
storing the acquired signals to a computer readable storage medium of the test and measurement apparatus;
determining a distribution of transition times of the acquired signal by a processor of the test and measurement apparatus;
applying a Q-scale algorithm by the processor of the test and measurement apparatus to evaluate the determined distribution at a bit error rate (BER), wherein the applying comprises:
scaling the BER with at least one coefficient;
evaluating the Q-scale as a function of the scaled BER;
determining the at least one coefficient to provide a most linear fit of the evaluated Q-scale points;
storing the at least one coefficient to a computer readable recording medium of the test and measurement apparatus; and
determining by a processor of the test and measurement apparatus whether a linearity of the evaluated Q-scale satisfies a linearity criterion at any of a plurality of coefficient values within a predetermined range.

4. A waveform processing system, comprising:
an acquisition module to acquire samples of a signal for a plurality of periods of the signal;
a processor operatively coupled to process the acquired samples; and
a memory containing instructions that, when executed by the processor, cause operations to be performed, the operations comprising:
determine a distribution of transition times of the acquired signal;
apply a Q-scale algorithm to evaluate the determined distribution at a bit error rate (BER), wherein the applying operation comprises:
scaling the BER with at least one coefficient;
evaluating the Q-scale as a function of the scaled BER; and
determining the at least one coefficient to provide a most linear fit of the evaluated Q-scale points; and
determining a standard deviation of a distribution from a reciprocal of a slope of the Q-scale.

5. A waveform processing system, comprising:
an acquisition module to acquire samples of a signal for a plurality of periods of the signal;
a processor operatively coupled to process the acquired samples; and
a memory containing instructions that, when executed by the processor, cause operations to be performed, the operations comprising:
determine a distribution of transition times of the acquired signal;
apply a Q-scale algorithm to evaluate the determined distribution at a bit error rate (BER), wherein the applying operation comprises:
scaling the BER with at least one coefficient;
evaluating the Q-scale as a function of the scaled BER; and
determining the at least one coefficient to provide a most linear fit of the evaluated Q-scale points; and
determining a mean of a distribution from an intercept of the Q-scale with an axis.

* * * * *